US011011660B1

(12) United States Patent
Derkacs et al.

(10) Patent No.: US 11,011,660 B1
(45) Date of Patent: May 18, 2021

(54) INVERTED METAMORPHIC MULTIJUNCTION SOLAR CELL

(71) Applicant: SolAero Technologies Corp., Albuquerque, NM (US)

(72) Inventors: Daniel Derkacs, Albuquerque, NM (US); Christopher Kerestes, Albuquerque, NM (US); Steven Whipple, Albuquerque, NM (US)

(73) Assignee: SolAero Technologies Corp., Albuquerque, NM (US)

( * ) Notice: Subject to any disclaimer, the term of this patent is extended or adjusted under 35 U.S.C. 154(b) by 394 days.

(21) Appl. No.: 16/037,378

(22) Filed: Jul. 17, 2018

(51) Int. Cl.

| | |
|---|---|
| ***H01L 31/0687*** | (2012.01) |
| ***H01L 31/0224*** | (2006.01) |
| ***H01L 31/0304*** | (2006.01) |
| ***H01L 31/18*** | (2006.01) |
| ***H01L 31/0693*** | (2012.01) |

(52) U.S. Cl.
CPC .................. *H01L 31/06875* (2013.01); *H01L 31/022425* (2013.01); *H01L 31/03046* (2013.01); *H01L 31/03048* (2013.01); *H01L 31/0693* (2013.01); *H01L 31/1844* (2013.01); *H01L 31/1848* (2013.01); *H01L 31/1892* (2013.01)

(58) Field of Classification Search
None
See application file for complete search history.

(56) References Cited

U.S. PATENT DOCUMENTS

| | | | | |
|---|---|---|---|---|
| 7,727,795 | B2 | 6/2010 | Stan et al. | |
| 7,741,146 | B2 | 6/2010 | Cornfeld et al. | |
| 7,785,989 | B2 | 8/2010 | Cornfeld et al. | |
| 7,960,201 | B2 | 6/2011 | Cornfeld et al. | |
| 8,039,291 | B2 | 10/2011 | Cornfeld et al. | |
| 2007/0277873 | A1 * | 12/2007 | Cornfeld | H01L 31/06 136/255 |
| 2009/0078308 | A1 * | 3/2009 | Varghese | H01L 31/06875 136/255 |
| 2014/0116500 | A1 * | 5/2014 | Stan | H01L 31/1844 136/255 |

OTHER PUBLICATIONS

U.S. Appl. No. 15/433,641, filed Feb. 15, 2017, Lin et al.
U.S. Appl. No. 14/485,121, filed Sep. 12, 2014, Lin et al.
U.S. Appl. No. 13/401,181, filed Feb. 21, 2012, Cornfeld et al.
(Continued)

*Primary Examiner* — Andres Munoz

(57) ABSTRACT

A method of manufacturing an inverted metamorphic multijunction solar cell by providing a growth semiconductor substrate with a top surface having a doping in the range of $1\times10^{18}$ to $1\times10^{20}$ charge carriers/cm$^3$; depositing a window layer for a top (light facing) subcell subsequently to be formed directly on the top surface of the growth substrate; depositing a sequence of layers of semiconductor material forming a solar cell directly on the window layer; providing a surrogate substrate on the top surface of the sequence of layers of semiconductor material, and removing a portion of the semiconductor substrate so that only the high doped surface portion of the substrate, having a thickness in the range of 0.5 μm to 10 μm, remains.

17 Claims, 21 Drawing Sheets

(56) References Cited

OTHER PUBLICATIONS

U.S. Appl. No. 12/271,192, filed Nov. 14, 2008, Cornfeld et al.
U.S. Appl. No. 12/023,772, filed Jan. 31, 2008, Stan et al.
U.S. Appl. No. 11/860,142, filed Sep. 24, 2007, Varghese et al.
U.S. Appl. No. 11/860,183, filed Sep. 24, 2007, Cornfeld et al.
U.S. Appl. No. 12/844,673, filed Jul. 27, 2010, Stan.
U.S. Appl. No. 12/813,408, filed Jul. 10, 2010, Patel et al.
U.S. Appl. No. 12/775,946, filed May 7, 2010, Newman.
U.S. Appl. No. 12/637,241, filed Dec. 14, 2009, Sharps et al.
U.S. Appl. No. 12/623,134, filed Nov. 20, 2009, Kats et al.
U.S. Appl. No. 12/544,001, filed Aug. 19, 2009, Cornfeld.
U.S. Appl. No. 12/401,137, filed Mar. 10, 2009, Varghese.
U.S. Appl. No. 12/401,157, filed Mar. 10, 2009, Newman et al.
U.S. Appl. No. 12/401,189, filed Mar. 10, 2009, Cornfeld.
U.S. Appl. No. 12/389,053, filed Feb. 19, 2009, Chumney et al.
U.S. Appl. No. 12/367,991, filed Feb. 9, 2009, Cornfeld et al.
U.S. Appl. No. 12/362,213, filed Jan. 29, 2009, Cornfeld.
U.S. Appl. No. 12/362,225, filed Jan. 29, 2009, Cornfeld.
U.S. Appl. No. 12/271,127, filed Nov. 14, 2008, Newman.
U.S. Appl. No. 12/267,812, filed Nov. 10, 2008, Cornfeld.
U.S. Appl. No. 12/258,190, filed Oct. 24, 2008, Cornfeld et al.
U.S. Appl. No. 12/253,051, filed Oct. 16, 2008, Cornfeld.
U.S. Appl. No. 12/716,814, filed Mar. 3, 2010, Cornfeld.
U.S. Appl. No. 12/708,361, filed Feb. 18, 2010, Cornfeld.
U.S. Appl. No. 12/187,477, filed Aug. 7, 2008, Varghese.
U.S. Appl. No. 12/218,558, filed Jul. 16, 2008, Varghese et al.
U.S. Appl. No. 12/218,582, filed Jul. 16, 2008, Varghese et al.
U.S. Appl. No. 12/123,864, filed May 20, 2008, Stan et al.
U.S. Appl. No. 12/102,550, filed Apr. 14, 2008, Stan et al.
U.S. Appl. No. 12/047,944, filed Mar. 13, 2008, Stan et al.
U.S. Appl. No. 11/956,069, filed Dec. 13, 2007, Stan et al.
U.S. Appl. No. 11/445,793, filed Jun. 2, 2006, Cornfeld et al.
U.S. Appl. No. 11/500,053, filed Aug. 7, 2006, McGlynn et al.
U.S. Appl. No. 12/417,367, filed Apr. 2, 2009, McGlynn et al.
U.S. Appl. No. 12/549,340, filed Aug. 27, 2009, McGlynn et al.
U.S. Appl. No. 12/337,043, filed Dec. 17, 2008, Stan et al.
Fatemi et al., "Qualification and Production of Emcore ZTJ Solar Panels for Space Missions", Photovoltaic Specialists Conference (PVSC), 2013 IEEE 39th (DOI: 10. 1109/PVSC 2013 6745052).
M. W. Wanlass et al., Lattice Mismatched Approaches for High Performance, III-V Photovoltaic Specialists Energy Converters (Conference Proceedings of the 31st IEEE Photovoltaic Specialists Conference, Jan. 3-7, 2005, IEEE Press, 2005).

* cited by examiner

INVERTED METAMORPHIC MULTIJUNCTION SOLAR CELL

REFERENCE TO RELATED APPLICATIONS

This application is related to U.S. patent application Ser. No. 15/433,641 filed Feb. 15, 2017 which is a continuation-in-part of U.S. patent application Ser. No. 14/485,121, filed Sep. 12, 2014, which in turn is a continuation-in-part of U.S. patent application Ser. No. 13/401,181, filed Feb. 21, 2012, which is in turn a continuation-in-part of U.S. patent application Ser. No. 12/271,192 filed Nov. 14, 2008, and of U.S. patent application Ser. No. 12/023,772, filed Jan. 31, 2008, which is in turn a continuation-in-part of U.S. patent application Ser. No. 11/860,142 filed Sep. 24, 2007, and of U.S. patent application Ser. No. 11/860,183, filed Sep. 24, 2007. The contents of the earlier applications are incorporated herein by reference in their entirety.

This application is related to U.S. patent application Ser. No. 12/844,673 filed Jul. 27, 2010.

This application is related to U.S. patent application Ser. No. 12/813,408 filed Jun. 10, 2010.

This application is related to U.S. patent application Ser. No. 12/775,946 filed May 7, 2010.

This application is related to U.S. patent application Ser. No. 12/716,814, filed Mar. 3, 2010.

This application is related to U.S. patent application Ser. No. 12/708,361, filed Feb. 18, 2010.

This application is related to U.S. patent application Ser. No. 12/637,241, filed Dec. 14, 2009.

This application is related to U.S. patent application Ser. No. 12/623,134, filed Nov. 20, 2009.

This application is related to U.S. patent application Ser. No. 12/544,001, filed Aug. 19, 2009.

This application is related to U.S. patent application Ser. Nos. 12/401,137, 12/401,157, and 12/401,189, filed Mar. 10, 2009.

This application is related to U.S. patent application Ser. No. 12/389,053, filed Feb. 19, 2009.

This application is related to U.S. patent application Ser. No. 12/367,991, filed Feb. 9, 2009.

This application is related to U.S. patent application Ser. No. 12/362,201, now U.S. Pat. No. 7,960,201; Ser. No. 12/362,213; and Ser. No. 12/362,225, filed Jan. 29, 2009.

This application is related to U.S. patent application Ser. No. 12/337,014 filed Dec. 17, 2008, now U.S. Pat. No. 7,785,989, and Ser. No. 12/337,043 filed Dec. 17, 2008.

This application is related to U.S. patent application Ser. No. 12/271,127 and Ser. No. 12/271,192 filed Nov. 14, 2008.

This application is related to U.S. patent application Ser. No. 12/267,812 filed Nov. 10, 2008.

This application is related to U.S. patent application Ser. No. 12/258,190 filed Oct. 24, 2008.

This application is related to U.S. patent application Ser. No. 12/253,051 filed Oct. 16, 2008.

This application is related to U.S. patent application Ser. No. 12/190,449, filed Aug. 12, 2008, now U.S. Pat. No. 7,741,146, and its divisional patent application Ser. No. 12/816,205, filed Jun. 15, 2010, now U.S. Pat. No. 8,039,291.

This application is related to U.S. patent application Ser. No. 12/187,477, filed Aug. 7, 2008.

This application is related to U.S. patent application Ser. No. 12/218,558 and U.S. patent application Ser. No. 12/218,582 filed Jul. 16, 2008.

This application is related to U.S. patent application Ser. No. 12/123,864 filed May 20, 2008.

This application is related to U.S. patent application Ser. No. 12/102,550 filed Apr. 14, 2008.

This application is related to U.S. Ser. No. 12/047,944, filed Mar. 13, 2008.

This application is related to U.S. patent application Ser. No. 12/023,772, filed Jan. 31, 2008.

This application is related to U.S. patent application Ser. No. 11/956,069, filed Dec. 13, 2007, and its divisional application Ser. No. 12/187,454 filed Aug. 7, 2008, now U.S. Pat. No. 7,727,795.

This application is also related to U.S. patent application Ser. Nos. 11/860,142 and 11/860,183 filed Sep. 24, 2007.

This application is also related to U.S. patent application Ser. No. 11/445,793 filed Jun. 2, 2006.

This application is also related to U.S. patent application Ser. No. 11/500,053 filed Aug. 7, 2006, and its divisional application Ser. No. 12/417,367 filed Apr. 2, 2009, and Ser. No. 12/549,340 filed Aug. 27, 2009.

All of the above applications are hereby incorporated by reference in their entirety.

BACKGROUND OF THE INVENTION

1. Field of the Invention

The present invention related to the field of multijunction solar cells based on III-V semiconductor compounds, and to fabrication processes and devices for three, four, five or six junction solar cell structures including one or more metamorphic layers. Some embodiments of such devices are also known as inverted metamorphic multijunction solar cells.

2. Description of the Related Art

Solar power from photovoltaic cells, also called solar cells, has been predominantly provided by silicon semiconductor technology. In the past several years, however, high-volume manufacturing of III-V compound semiconductor multijunction solar cells for space applications has accelerated the development of such technology. Compared to silicon, III-V compound semiconductor multijunction devices have greater energy conversion efficiencies and are generally more radiation resistance, although they tend to be more complex to properly specify and manufacture. Typical commercial III-V compound semiconductor multijunction solar cells have energy efficiencies that exceed 29.5% under one sun, air mass 0 (AM0) illumination, whereas even the most efficient silicon technologies generally reach only about 18% efficiency under comparable conditions. The higher conversion efficiency of III-V compound semiconductor solar cells compared to silicon solar cells is in part based on the ability to achieve spectral splitting of the incident radiation through the use of a plurality of vertically adjacent photovoltaic regions (referred to as "subcells" or "junctions") each with different band gap energies, the solar cell structure thereby accumulating the voltage at a given current from each of the regions.

In satellite and other space related applications, the size, mass and cost of a satellite power system are dependent on the power and energy conversion efficiency of the solar cells used. Putting it another way, the size of the payload and the availability of on-board services are proportional to the amount of power provided. Thus, as payloads use increasing amounts of power as they become more sophisticated, and missions and applications anticipated for five, ten, twenty or more years, the power-to-weight ratio and lifetime efficiency of a solar cell becomes increasingly more important. There is increasing interest not only the amount of power provided at initial deployment, but over the entire service life of the satellite system, or in terms of a design specification, the amount of power provided at the "end of life" (EOL) which is affected by the radiation exposure of the solar cell over time in a space environment.

Typical III-V compound semiconductor solar cells are epitaxially grown on a bulk semiconductor substrate or wafer in vertical, multijunction structures or sequence of solar subcells. Each subcell is formed with specifically designed semiconductor layers and includes a p type base layer and n+ type emitter layer which form a p-n photoactive junction and produces an electrical current. Each respective subcell is designed to convert photons over different spectral or wavelength bands to electrical current. Tunnel diodes are disposed between each individual subcell to ensure that the generated electrical current flows only in one direction in the vertical structure. After the sunlight impinges on the front of the solar cell, and photons pass through the subcells, with each subcell being designed for photons in a specific wavelength band. After passing through a subcell, the photons that are not absorbed and converted to electrical energy in that subcell will propagate to the next subcell which is intentionally designed with a lower band gap, where such photons having energy in that band gap range are intended to be captured and converted to electrical energy.

The solar cells used in many arrays often have a substantial size; for example, in the case of the single standard substantially "square" solar cell trimmed from a 100 mm wafer with cropped corners, the solar cell can have a side length of 7 cm or more. The individual solar cells or wafers are then disposed in horizontal arrays, with the individual solar cells connected together by a metal "interconnect" to form an electrical series and/or parallel circuit. The shape and structure of an array, as well as the number of cells it contains, are determined in part by the desired output voltage and current needed by the payload or subcomponents of the payload, the amount of electrical storage capacity (batteries) on the spacecraft, and the power demands of the payloads during different orbital configurations.

A solar cell designed for use in a space vehicle (such as a satellite, space station, or an interplanetary mission vehicle), has a sequence of subcells with compositions and band gaps which have been optimized to achieve maximum energy conversion efficiency for the AM0 solar spectrum in space. The AM0 solar spectrum in space is notably different from the AM1.5 solar spectrum at the surface of the earth, and accordingly terrestrial solar cells are designed with subcell band gaps optimized for the AM1.5 solar spectrum.

There are substantially more rigorous qualification and acceptance testing protocols used in the manufacture of space solar cells compared to terrestrial cells, to ensure that space solar cells can operate satisfactorily at the wide range of temperatures and temperature cycles encountered in space. These testing protocols include (i) high-temperature thermal vacuum bake-out; (ii) thermal cycling in vacuum (TVAC) or ambient pressure nitrogen atmosphere (APTC); and in some applications (iii) exposure to radiation equivalent to that which would be experienced in the space mission, and measuring the current and voltage produced by the cell and deriving cell performance data.

As used in this disclosure and claims, the term "space-qualified" shall mean that the electronic component (i.e., the solar cell) provides satisfactory operation under the high temperature and thermal cycling test protocols. The exemplary conditions for vacuum bake-out testing include exposure to a temperature of +100° C. to +135° C. (e.g., about +100° C., +110° C., +120° C., +125° C., +135° C.) for 2 hours to 24 hours, 48 hours, 72 hours, or 96 hours; and exemplary conditions for TVAC and/or APTC testing that include cycling between temperature extremes of −180° C. (e.g., about −180° C., −175° C., −170° C., −165° C., −150° C., −140° C., −128° C., −110° C., −100° C., −75° C., or −70° C.) to +145° C. (e.g., about +70° C., +80° C., +90° C., +100° C., +110° C., +120° C., +130° C., +135° C., or +145° C.) for 600 to 32,000 cycles (e.g., about 600, 700, 1500, 2000, 4000, 5000, 7500, 22000, 25000, or 32000 cycles), and in some space missions up to +180° C. See, for example, Fatemi et al., "Qualification and Production of Emcore ZTJ Solar Panels for Space Missions," Photovoltaic Specialists Conference (PVSC), 2013 IEEE 39th (DOI: 10. 1109/PVSC 2013 6745052). Such rigorous testing and qualifications are not generally applicable to terrestrial solar cells and solar cell arrays.

Conventionally, such measurements are made for the AM0 spectrum for "one-sun" illumination, but for PV systems which use optical concentration elements, such measurements may be made under concentrations such as 2×, 100×, or 1000× or more.

The space solar cells and arrays experience a variety of complex environments in space missions, including the vastly different illumination levels and temperatures seen during normal earth orbiting missions, as well as even more challenging environments for deep space missions, operating at different distances from the sun, such as at 0.7, 1.0 and 3.0 AU (AU meaning astronomical units). The photovoltaic arrays also endure anomalous events from space environmental conditions, and unforeseen environmental interactions during exploration missions. Hence, electron and proton radiation exposure, collisions with space debris, and/or normal aging in the photovoltaic array and other systems could cause suboptimal operating conditions that degrade the overall power system performance, and may result in failures of one or more solar cells or array strings and consequent loss of power.

A further distinctive difference between space solar cell arrays and terrestrial solar cell arrays is that a space solar cell array utilizes welding and not soldering of the metal interconnect to provide robust electrical interconnections between the solar cells, while terrestrial solar cell arrays typically utilize solder for such electrical interconnections. Welding is required in space solar cell arrays to provide the very robust electrical connections that can withstand the wide temperature ranges and temperature cycles encountered in space such as from −175° C. to +180° C. In contrast, solder joints are typically sufficient to survive the rather narrow temperature ranges (e.g., about −40° C. to about +50° C.) encountered with terrestrial solar cell arrays.

A further distinctive difference between space solar cell arrays and terrestrial solar cell arrays is that a space solar cell array utilizes an interconnect composed of silver-plated metal material, while terrestrial solar cells typically utilize copper wire for interconnects. In some embodiments, the interconnection member can be, for example, a metal plate. Useful metals include, for example, molybdenum; a nickel-cobalt ferrous alloy material designed to be compatible with the thermal expansion characteristics of borosilicate glass such as that available under the trade designation KOVAR from Carpenter Technology Corporation; a nickel iron alloy material having a uniquely low coefficient of thermal expansion available under the trade designation Invar, FeNi36, or 64FeNi; or the like.

An additional distinctive difference between space solar cell arrays and terrestrial solar cell arrays is that space solar cell arrays typically utilize an aluminum honeycomb panel for a substrate or mounting platform. In some embodiments, the aluminum honeycomb panel may include a carbon composite face sheet adjoining the solar cell array. In some embodiments, the face sheet may have a coefficient of thermal expansion (CTE) that substantially matches the CTE of the bottom germanium (Ge) layer of the solar cell that is attached to the face sheet. Substantially matching the CTE of the face sheet with the CTE of the Ge layer of the solar cell can enable the array to withstand the wide temperature ranges encountered in space without the solar cells cracking, delaminating, or experiencing other defects. Such precautions are generally unnecessary in terrestrial applications.

Thus, a further distinctive difference of a space solar cell from a terrestrial solar cell is that the space solar cell must include a cover glass over the semiconductor device to provide radiation resistant shielding from particles in the space environment which could damage the semiconductor material. The cover glass is typically a ceria doped borosilicate glass which is typically from three to six mils in thickness and attached by a transparent adhesive to the solar cell.

In summary, it is evident that the differences in design, materials, and configurations between a space-qualified III-V compound semiconductor solar cell and subassemblies and arrays of such solar cells, on the one hand, and silicon solar cells or other photovoltaic devices used in terrestrial applications, on the other hand, are so substantial that prior teachings associated with silicon or other terrestrial photovoltaic system are simply unsuitable and have no applicability to the design configuration of space-qualified solar cells and arrays. Indeed, the design and configuration of components adapted for terrestrial use with its modest temperature ranges and cycle times often teach away from the highly demanding design requirements for space-qualified solar cells and arrays and their associated components.

The fabrication of an individual solar cell together with electrical interconnects and the cover glass form a so-called "CIC" (Cell-Interconnected-Cover glass) subassembly. These subassemblies are then typically electrically connected, typically in a "string", to form an assembly or array of series-connected solar cells. From a satellite panel assembly perspective, the basic component utilized in the production process of the panel may either be a single CIC "subassembly", or a pre-connected string of several series-connected CICs forming an "assembly". (The use of the terms "subassembly" and "assembly" is not always as well defined or differentiated as suggested above. Accordingly, such terminology may not always be used consistently in the present or related disclosures. Thus, a CIC may be referred to as a "subassembly" or an "assembly" depending upon the context.)

The radiation hardness of a solar cell is defined as how well the cell performs after exposure to the electron or proton particle radiation which is a characteristic of the space environment. A standard metric is the ratio of the end of life performance (or efficiency) divided by the beginning of life performance (EOL/BOL) of the solar cell. The EOL performance is the cell performance parameter after exposure of that test solar cell to a given fluence of electrons or protons (which may be different for different space missions or orbits). The BOL performance is the performance parameter prior to exposure to the particle radiation.

Charged particles in space could lead to damage to solar cell structures, and in some cases, dangerously high voltage being established across individual devices or conductors in the solar array. These large voltages can lead to catastrophic electrostatic discharging (ESD) events. Traditionally for ESD protection the backside of a solar array may be painted with a conductive coating layer to ground the array to the space plasma, or one may use a honeycomb patterned metal panel which mounts the solar cells and incidentally protects the solar cells from backside radiation.

The radiation hardness of the semiconductor material of the solar cell itself is primarily dependent on a solar cell's minority carrier diffusion length ($L_{min}$) in the base region of the solar cell (the term "base" region referring to the p type base semiconductor region disposed directly adjacent to an n+ type "emitter" semiconductor region, the boundary of which establishes the p-n photovoltaic junction). The less degraded the parameter $L_{min}$, is after exposure to particle radiation, the less the solar cell performance will be reduced. A number of strategies have been used to either improve $L_{min}$, or make the solar cell less sensitive to $L_{min}$ reductions. Improving $L_{min}$ has largely involved including a gradation in dopant elements in the semiconductor base layer of the subcells so as to create an electric field to direct minority carriers to the junction of the subcell, thereby effectively increasing $L_{min}$. The effectively longer $L_{min}$ will improve the cell performance, even after the particle radiation exposure. Making the cell less sensitive to $L_{min}$ reductions has involved increasing the optical absorption of the base layer such that thinner layers of the base can be used to absorb the same amount of incoming optical radiation.

Another consideration in connection with the manufacture of space solar cell arrays is that conventionally, solar cells have been arranged on a support and interconnected using a substantial amount of manual labor. For example, first individual CICs are produced with each interconnect individually welded to the solar cell, and each cover glass individually mounted. Then, these CICs are connected in series to form strings, generally in a substantially manual manner, including the welding steps from CIC to CIC. Then, these strings are applied to a panel substrate and electrically interconnected in a process that includes the application of adhesive, wiring, etc. All of this has traditionally been carried out in a manual and substantially artisanal manner.

The energy conversion efficiency of multijunction solar cells is affected by such factors as the number of subcells, the thickness of each subcell, the composition and doping of each active layer in a subcell, and the consequential band structure, electron energy levels, conduction, and absorption of each subcell, as well as the effect of its exposure to radiation in the ambient environment over time. The identification and specification of such design parameters is a non-trivial engineering undertaking, and would vary depending upon the specific space mission and customer design requirements. Since the power output is a function of both the voltage and the current produced by a subcell, a simplistic view may seek to maximize both parameters in a subcell by increasing a constituent element, or the doping level, to achieve that effect. However, in reality, changing a material parameter that increases the voltage may result in a decrease in current, and therefore a lower power output. Such material design parameters are interdependent and interact in complex and often unpredictable ways, and for that reason are not "result effective" variables that those skilled in the art confronted with complex design specifications and practical operational considerations can easily adjust to optimize performance.

Moreover, the current (or more precisely, the short circuit current density $J_{sc}$ and the voltage (or more precisely, the open circuit voltage $V_{oc}$) are not the only factors that determine the power output of a solar cell. In addition to the power being a function of the short circuit density ($J_{sc}$), and the open circuit voltage ($V_{oc}$), the output power is actually computed as the product of $V_{oc}$ and $J_{sc}$, and a Fill Factor (FF). As might be anticipated, the Fill Factor parameter is not a constant, but in fact may vary at a value between 0.5 and somewhat over 0.85 for different arrangements of elemental compositions, subcell thickness, and the dopant level and profile. Although the various electrical contributions to the Fill Factor such as series resistance, shunt resistance, and ideality (a measure of how closely the semiconductor diode follows the ideal diode equation) may be theoretically understood, from a practical perspective the actual Fill Factor of a given subcell cannot always be predicted, and the effect of making an incremental change in composition or band gap of a layer may have unanticipated consequences and effects on the solar subcell semiconductor material, and therefore an unrecognized or unappreciated effect on the Fill Factor. Stated another way, an attempt to maximize power by varying a composition of a subcell layer to increase the $V_{oc}$ or $J_{sc}$ or both of that subcell, may in fact not result in high power, since although the product $V_{oc}$ and $J_{sc}$ may increase, the FF may decrease and the resulting power also decrease. Thus, the $V_{oc}$ and $J_{sc}$ parameters, either alone or in combination, are not necessarily "result effective" variables that those skilled in the art confronted with complex design specifications and practical operational considerations can easily adjust to optimize performance.

Furthermore, the fact that the short circuit current density ($J_{sc}$), the open circuit voltage ($V_{oc}$), and the fill factor (FF), are affected by the slightest change in such design variables, the purity or quality of the chemical pre-cursors, or the specific process flow and fabrication equipment used, and such considerations further complicates the proper specification of design parameters and predicting the efficiency of a proposed design which may appear "on paper" to be advantageous.

It must be further emphasized that in addition to process and equipment variability, the "fine tuning" of minute changes in the composition, band gaps, thickness, and doping of every layer in the arrangement has critical effect on electrical properties such as the open circuit voltage ($V_{oc}$) and ultimately on the power output and efficiency of the solar cell.

To illustrate the practical effect, consider a design change that results in a small change in the $V_{oc}$ of an active layer in the amount of 0.01 volts, for example changing the $V_{oc}$ from 2.72 to 2.73 volts. Assuming all else is equal and does not change, such a relatively small incremental increase in voltage would typically result in an increase of solar cell efficiency from 29.73% to 29.84% for a triple junction solar cell, which would be regarded as a substantial and significant improvement that would justify implementation of such design change.

For a single junction GaAs subcell in a triple junction device, a change in $V_{oc}$ from 1.00 to 1.01 volts (everything else being the same) would increase the efficiency of that junction from 10.29% to 10.39%, about a 1% relative increase. If it were a single junction stand-alone solar cell, the efficiency would go from 20.58% to 20.78%, still about a 1% relative improvement in efficiency.

Present day commercial production processes are able to define and establish band gap values of epitaxially deposited layers as precisely as 0.01 eV, so such "fine tuning" of compositions and consequential open circuit voltage results are well within the range of operational production specifications for commercial products.

Another important mechanical or structural consideration in the choice of semiconductor layers for a solar cell is the desirability of the adjacent layers of semiconductor materials in the solar cell, i.e. each layer of crystalline semiconductor material that is deposited and grown to form a solar subcell, have similar or substantially similar crystal lattice constants or parameters.

Here again there are trade-offs between including specific elements in the composition of a layer which may result in improved voltage associated with such subcell and therefore potentially a greater power output, and deviation from exact crystal lattice matching with adjoining layers as a consequence of including such elements in the layer which may result in a higher probability of defects, and therefore lower manufacturing yield.

In that connection, it should be noted that there is no strict definition of what is understood to mean two adjacent layers are "lattice matched" or "lattice mismatched". For purposes in this disclosure, "lattice mismatched" refers to two adjacently disposed materials or layers (with thicknesses of greater than 100 nm) having in-plane lattice constants of the materials in their fully relaxed state differing from one another by less than 0.02% in lattice constant. (Applicant notes that this definition is considerably more stringent than that proposed, for example, in U.S. Pat. No. 8,962,993, which suggests less than 0.6% lattice constant difference as defining "lattice mismatched" layers).

Inverted metamorphic solar cell structures based on III-V compound semiconductor layers, such as described in M. W. Wanlass et al., Lattice Mismatched Approaches for High Performance, III-V Photovoltaic Energy Converters (Conference Proceedings of the 31.sup.st IEEE Photovoltaic Specialists Conference, Jan. 3-7, 2005, IEEE Press, 2005), present an important conceptual starting point for the development of future commercial high efficiency solar cells. However, the materials and structures for a number of different layers of the cell proposed and described in such reference present a number of practical difficulties relating to the appropriate choice of materials and fabrication steps.

Prior to the disclosures described in various ones or combinations of this and the related applications noted above, the materials and fabrication steps disclosed in the prior art have various drawbacks and disadvantages in producing a commercially viable inverted metamorphic multijunction solar cell using commercially established fabrication processes.

SUMMARY OF THE DISCLOSURE

Objects of the Disclosure

It is an object of the present disclosure to provide a process for fabricating an inverted metamorphic multijunction solar cell which reduces the effects of contaminants or defects present in the contact layer.

It is another object of the present disclosure to provide an inverted multijunction solar cell which utilizes a portion of the growth substrate as a contact layer in place of a separately grown contact or cap layer.

It is another object of the present disclosure to improve the fill factor in an inverted metamorphic multijunction solar cell by reducing the effects of contaminants or defects during the epitaxial growth process.

It is another object of the present invention to reduce or eliminate shunting in the contact and window layers of an inverted multijunction solar cell caused by cracks formed during a wet etching process and metallization creeping into such cracks during grid formation.

Some implementations of the present disclosure may incorporate or implement fewer of the aspects and features noted in the foregoing objects.

Features of the Disclosure

All ranges of numerical parameters set forth in this disclosure are to be understood to encompass any and all subranges or "intermediate generalizations" subsumed herein. For example, a stated range of "1.0 to 2.0 eV" for a band gap value should be considered to include any and all subranges beginning with a minimum value of 1.0 eV or more and ending with a maximum value of 2.0 eV or less, e.g., 1.0 to 1.6, or 1.3 to 1.4, or 1.5 to 1.9 eV.

Briefly, and in general terms, the present disclosure provides a method of manufacturing a solar cell comprising: providing a growth semiconductor substrate with a top surface having a doping in the range of $1\times10^{18}$ to $1\times10^{20}$ charge carriers/cm$^3$; depositing a window layer directly on the top surface of the growth substrate; depositing a sequence of layers of semiconductor material forming a solar cell directly on the window layer; providing a glass surrogate substrate; bonding an adhesive polyimide layer to the glass surrogate substrate; adjoining the surface of the adhesive polyimide layer of the glass surrogate substrate to the top surface of the sequence of layers of semiconductor material forming a solar cell and permanently bonding it thereto; and removing a portion of the semiconductor substrate so that only a portion of the substrate having a thickness in the range of 0.5 μm to 10 μm remains.

In some embodiments, the removal of the portion of the semiconductor substrate that is removed after the surrogate substrate has been attached is performed by grinding, polishing, lapping or etching of the semiconductor substrate.

In some embodiments, there further comprises forming grid electrodes on the top surface of the growth substrate to form a top surface of the solar cell.

In some embodiments, there further comprises attaching a cover glass to the top surface of the solar cell over the grid electrodes.

In some embodiments, said step of depositing a sequence of layers of semiconductor material includes forming a first solar subcell on said substrate having a first band gap; forming a second solar subcell over said first subcell having a second band gap smaller than said first band gap; forming a grading interlayer over said second subcell having a third band gap larger than said second band gap; forming a third solar subcell having a fourth band gap smaller than said second band gap such that said third subcell is lattice mismatched with respect to said second subcell.

In some embodiments, the growth substrate is composed of GaAs having a thickness of between 300 μm and 700 μm.

In some embodiments, the first solar subcell is composed of an InGa(A1)P emitter region and an InGa(Al)P base region.

In some embodiments, the first subcell is composed of an GaInP, GaAs, GaInAs, GaAsSb, or GaInAsN emitter region and an GaAs, GaInAs, GaAsSb, or GaInAsN base region, and the second subcell is composed of an InGaP emitter layer and a GaAs or GaInAs base layer.

In some embodiments, the lower solar subcell is composed of an InGaAs base and emitter layer, or a InGaAs base layer and a InGaP emitter layer.

In some embodiments, the graded interlayer is compositionally graded to lattice match the middle subcell on one side and the lower subcell on the other side, and is composed of $(In_xGa_{1-x})_y Al_{1-y}As$, wherein $0<x<1$ and $0<y<1$ with x and y selected such that the band gap of the interlayer is greater than said second band gap.

In some embodiments, the grading interlayer has a band gap in the range of 1.5 to 1.6 eV throughout its thickness.

In some embodiments, the step of depositing a sequence of layers of semiconductor material on the window layer comprises: depositing a first sequence of layers of semiconductor material forming a first solar subcell directly on the window layer; forming a second solar subcell adjacent to said first solar subcell and having a second band gap smaller than said first band gap; forming a first grading interlayer adjacent to said second solar subcell; said first grading interlayer having a third band gap greater than said second band gap; forming a third solar subcell adjacent to said first graded interlayer, said third subcell having a fourth band gap smaller than said second band gap such that said third subcell is lattice mismatched with respect to said second subcell; forming a second grading interlayer adjacent to said third solar subcell; said second grading interlayer having a fifth band gap greater than said fourth band gap; forming a lower fourth solar subcell adjacent to said second grading interlayer, said lower subcell having a sixth band gap smaller than said fourth band gap such that said fourth subcell is lattice mismatched with respect to said third subcell; and the first grading interlayer being compositionally graded to lattice match the third solar subcell on one side and the fourth solar subcell on the other side.

In some embodiments, the step of bonding an adhesive polyimide to the permanent glass surrogate substrate comprises performing the bonding step by a thermocompressive technique at a curing temperature above 350 degrees C.; and adjoining the cured adhesive polyimide layer surface and the glass surrogate substrate to the surface of the sequence of layers of semiconductor material forming a solar cell at a temperature of about 300 degrees C.

In some embodiments, the window layer is composed of AlInP.

In some embodiments, there further comprises a threading dislocation inhibition layer having a thickness in the range of 0.10 to 1.0 microns and disposed between the second solar subcell and the grading interlayer and having a different composition from the grading interlayer.

In some embodiments, there further comprises a second threading dislocation inhibition layer having a thickness in the range of 0.10 to 1.0 micron and composed of InGa(Al)P, the second threading dislocation inhibition layer being disposed directly adjacent to said grading interlayer and the third solar subcell for reducing the propagation of threading dislocations, said second threading dislocation inhibition layer having a composition different from a composition of the first threading dislocation inhibition layer and the grading interlayer.

In some embodiments, the growth substrate is composed of a bulk p type GaAs substrate with a top surface being doped.

In some embodiments, the growth substrate is composed of a bulk n+ type GaAs substrate with a top surface being doped to n++ type conductivity.

In another aspect, the present disclosure provides a method of manufacturing a solar cell comprising: providing a first p type substrate including a highly doped n++ type surface layer; forming a window layer directly on the highly doped surface layer of the first substrate; forming an upper first solar subcell having a first band gap directly on the window layer; forming a second solar subcell adjacent to said first solar subcell and having a second band gap smaller than said first band gap; forming a first graded interlayer adjacent to said second solar subcell; said first graded interlayer having a third band gap greater than said second band gap; forming a third solar subcell adjacent to said first graded interlayer, said third subcell having a fourth band gap smaller than said second band gap such that said third subcell is lattice mismatched with respect to said second subcell; forming a second graded interlayer adjacent to said third solar subcell; said second graded interlayer having a fifth band gap greater than said fourth band gap; forming a lower fourth solar subcell adjacent to said second graded interlayer, said lower subcell having a sixth band gap smaller than said fourth band gap such that said fourth subcell is lattice mismatched with respect to said third subcell; mounting a surrogate substrate on top of the fourth solar subcell; removing a bottom portion of the first substrate so that only the highly doped surface layer or a portion thereof having a thickness in the range of 0.5 μm to 10 μm remains.

A multijunction solar cell comprising: a window layer forming the top surface layer of the solar cell; an upper or first solar subcell having a first band gap directly adjacent to and epitaxially grown on the window layer; a second solar subcell adjacent to the first solar subcell and having a second band gap smaller than the first band gap; a grading interlayer disposed below, and adjacent to, the second solar subcell, has a third band gap throughout the thickness of the interlayer greater than the second band gap; and a third solar subcell disposed below the grading interlayer and lattice mismatched with respect to the second solar subcell, and having a fourth band gap smaller than the third band gap; wherein the grading interlayer achieves a transition in lattice constant from the second subcell to the third subcell; and wherein each of the first solar subcell, the second solar subcell, the grading interlayer and the third solar subcell comprises one or more epitaxial layers of a same integrated semiconductor structure grown on the contact layer.

In some instances, the metamorphic grading interlayers are composed of AlGaInAs with compositionally step-graded series of AlGaInAs, for example, having a monotonically or step graded changing lattice constant, so as to achieve a transition in lattice constant in the semiconductor structure between lattice mismatched subcells. In some cases, the structure helps reduce or minimize the occurrence of threading dislocations.

Significant improvement in conversion efficiency can be obtained for devices in which one graded interlayer has a band gap of about 1.5 eV-1.6 eV and a second graded interlayer has a band gap of 1.1 eV. In some cases, the first graded interlayer has a band gap of 1.5 eV (±3%) or 1.6 eV (±3%), and the second graded interlayer has a band gap of 1.1 eV (+3%). Thus, in some cases, the first graded interlayer has a band gap in the range of 1.5 eV-1.65 eV.

In some embodiments, the base and emitter of the upper first solar subcell is composed of AlGaInP.

In some embodiments, the band gap of the base of the upper first solar subcell is equal to or greater than 2.05 eV.

In some embodiments, the emitter of the upper first solar subcell is composed of a first region in which the doping is graded from $3\times10^{18}$ to $1\times10^{18}$ free carriers per cubic centimeter, and a second region directly disposed over the first region in which the doping is constant at $1\times10^{17}$ free carriers per cubic centimeter.

In some embodiments, the first region of the emitter of the upper first solar subcell is directly adjacent to the window layer.

In some embodiments, the emitter of the upper first solar subcell has a thickness of 80 nm.

In some embodiments, there is a spacer layer between the emitter and the base of the upper first solar subcell. In some embodiments, the spacer layer between the emitter and the base of the upper first solar subcell is composed of unintentionally doped AlGaInP.

In some embodiments, the base of the upper first solar subcell has a thickness of less than 400 nm.

In some embodiments, the base of the upper first solar subcell has a thickness of 260 nm.

In some embodiments, the emitter section of the upper first solar subcell has a free carrier density of $3\times10^{18}$ to $9\times10^{18}$ per cubic centimeter.

In some embodiments, in particular in connection with a five junction solar cell utilizing two metamorphic layers, the lower fifth subcell has a band gap in the range of approximately 0.85 to 0.95 eV, the fourth subcell has a band gap in the range of approximately 1.0 to 1.2 eV; the third subcell has a band gap in the range of approximately 1.3 to 1.5 eV, the second subcell has a band gap in the range of approximately 1.65 to 1.80 eV and the upper subcell has a band gap in the range of 1.9 to 2.2 eV.

In some implementations, it is advantageous for the band gap of the first graded interlayer to be substantially constant at approximately 1.6 eV and the band gap of the second graded interlayer to be substantially constant at approximately 1.1 eV. In some embodiments, in particular in connection with a six junction solar cell utilizing three metamorphic layers, the band gap of the first graded interlayer remains constant at 1.5 eV or 1.6 eV throughout the thickness of the first graded interlayer, the band gap of the second graded interlayer remains constant at 1.5 eV or 1.6 eV throughout the thickness of the second graded interlayer, and the band gap of the third graded interlayer remains constant at 1.1 eV throughout the thickness of the third graded interlayer.

In some embodiments, in particular in connection with a six junction solar cell utilizing three metamorphic layers, the upper subcell is composed of an AlGaInP emitter layer and an AlGaInP base layer, the second subcell is composed of AlGaAs emitter layer and a AlGaAs base layer, the third subcell is composed of a GaInP emitter layer and a GaAs base layer, the fourth subcell is composed of a GaInAs emitter layer and a GaInAs base layer, the fifth subcell is composed of a GaInAs emitter layer and a GaInAs base layer, and the bottom sixth subcell is composed of a GaInAs emitter layer and a GaInAs base layer.

Some implementations of the present disclosure may incorporate or implement fewer of the aspects and features noted in the foregoing summaries.

Reference throughout this specification to "one embodiment" or "an embodiment" means that a particular feature, structure, or characteristic described in connection with the embodiment is included in at least one embodiment of the present disclosure. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

Additional aspects, advantages, and novel features of the present disclosure will become apparent to those skilled in the art from this disclosure, including the following detailed description as well as by practice of the disclosure. While the disclosure is described below with reference to preferred embodiments, it should be understood that the disclosure is not limited thereto. Those of ordinary skill in the art having access to the teachings herein will recognize additional applications, modifications and embodiments in other fields, which are within the scope of the disclosure as disclosed and claimed herein and with respect to which the disclosure could be of utility.

BRIEF DESCRIPTION OF THE DRAWINGS

The disclosure will be better and more fully appreciated by reference to the following detailed description when considered in conjunction with the accompanying drawings, wherein.

GLOSSARY OF TERMS

Figure 1A:
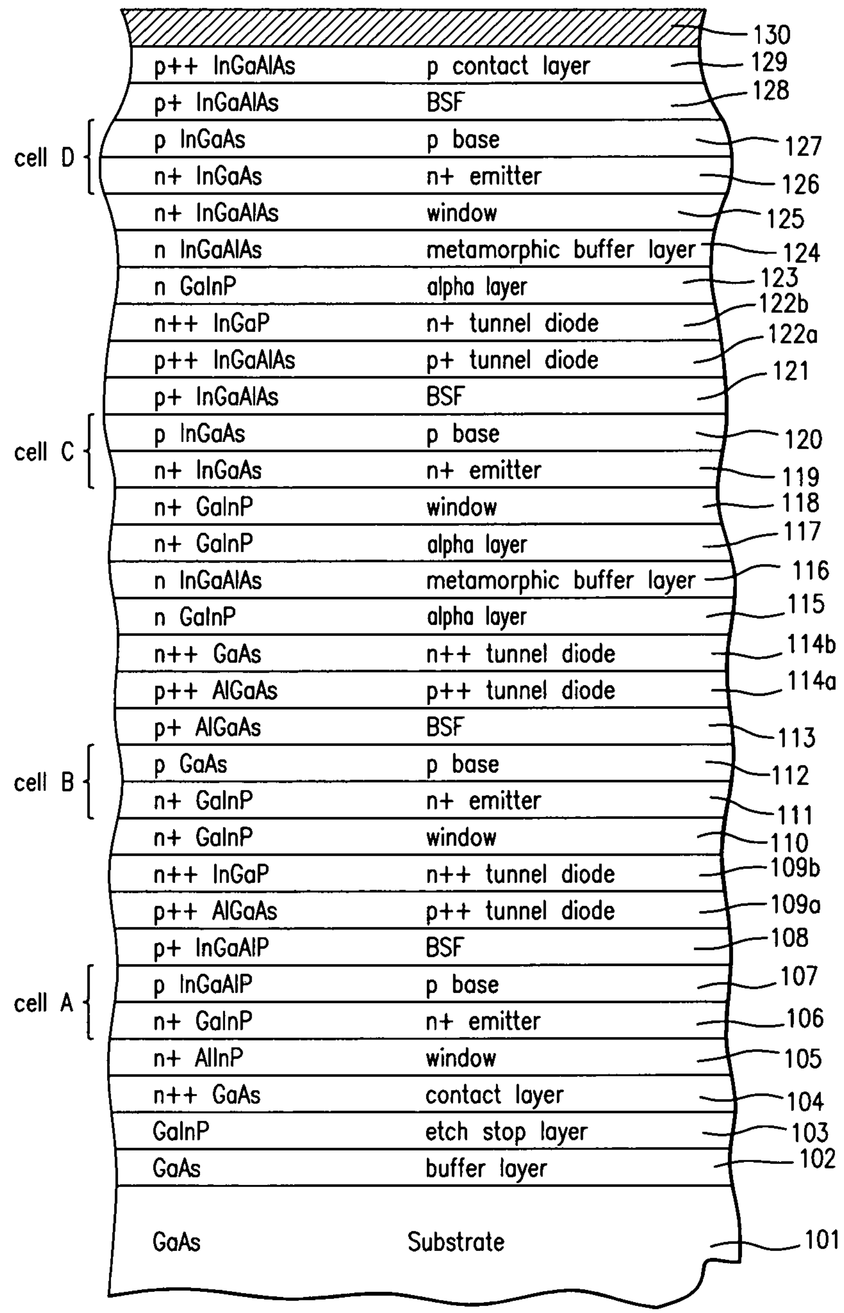
FIG. 1A is a cross-sectional view of the solar cell of one embodiment of a multijunction solar cell as described in earlier applications of the Applicant after an initial stage of fabrication including the deposition of certain semiconductor layers on the growth substrate.

"III-V compound semiconductor" refers to a compound semiconductor formed using at least one element from group III of the periodic table and at least one element from group V of the periodic table. III-V compound semiconductors include binary, tertiary and quaternary compounds. Group III includes boron (B), aluminum (Al), gallium (Ga), indium (In) and thallium (T). Group V includes nitrogen (N), phosphorus (P), arsenic (As), antimony (Sb) and bismuth (Bi).

"Band gap" refers to an energy difference (e.g., in electron volts (eV)) separating the top of the valence band and the bottom of the conduction band of a semiconductor material. More particularly, the expression "band gap" of a solar subcell, which internally has layers of different band gaps shall be defined to mean the band gap of the layer of the solar subcell in which the majority of the charge carriers are generated (such sublayer typically being the p-type base semiconductor layer of the base/emitter photovoltaic junction of such subcell). In the event such layer in turn has sublayers with different band gaps (such as the case of a base layer having a graded composition and more particularly a graded band gap), the sublayer of that solar subcell with the lowest band gap shall be taken as defining the "band gap" of such a subcell. Apart from a solar subcell, and more generally in the case of a specifically designated semiconductor region (such as a metamorphic layer), in which that semiconductor region has sublayers or subregions with different band gaps (such as the case of a semiconductor region having a graded composition and more particularly a graded band gap), the sublayer or subregion of that semiconductor region with the lowest band gap shall be taken as defining the "band gap" of that semiconductor region.

"Beginning of Life (BOL)" refers to the time at which a photovoltaic power system is initially deployed in operation. In practice, the BOL performance of a solar cell is measured experimentally in a laboratory on earth prior to the solar cell being deployed in outer space.

"Bottom subcell" refers to the subcell in a multijunction solar cell which is furthest from the primary light source for the solar cell.

"CIC" (or Cell-Interconnected-Cover glass) refers to the fabricated combination of an individual solar cell together with electrical interconnects to the solar cell and a cover glass mounted on and bonded to the upper surface of the solar cell.

"Compound semiconductor" refers to a semiconductor formed using two or more chemical elements.

"Current density" refers to the short circuit current density Jsc through a solar subcell through a given planar area, or volume, of semiconductor material constituting the solar subcell.

"Deposited", with respect to a layer of semiconductor material, refers to a layer of material which is epitaxially grown over another semiconductor layer (such as in an MOCVD reactor) so as to form a monolithic crystalline semiconductor structure.

"Dopant" refers to a trace impurity element that is contained within a semiconductor material to affect the electrical or optical characteristics of that material. As used in the context of the present disclosure, typical dopant levels in semiconductor materials are in the $10^{16}$ to $10^{19}$ atoms per cubic centimeter range. The standard notation or nomenclature, when a particular identified dopant is proscribed, is to use, for example, the expression "GaAs:Se" or "GaAs:C" for selenium or carbon doped gallium arsenide respectively. Whenever a ternary or quaternary compound semiconductor is expressed as "AlGaAs" or "GaInAsP", it is understood that all three or four of the constituent elements are much higher in mole concentration, say on the 1% level or above, which is in the $10^{21}$ atoms/$cm^{-3}$ or larger range. Such constituent elements are not considered "dopants" by those skilled in the art since the atoms of the constituent element form part of the crystal structure (i.e., are situated on the crystal lattice sites) of the compound semiconductor. In addition, a further distinction is that a dopant has a different valence number than the constituent component elements. In a commonly implemented III-V compound semiconductor such as AlGaInAs, none of the individual elements Al, Ga, In, or As are considered to be dopants since they have the same valence as the component atoms that make up the crystal lattice.

"End of Life (EOL)" refers to a predetermined time or times after the Beginning of Life, during which the photovoltaic power system has been deployed and has been operational. The EOL time or times may, for example, be specified by the customer as part of the required technical performance specifications of the photovoltaic power system to allow the solar cell designer to define the solar cell subcells and sublayer compositions of the solar cell to meet the technical performance requirement at the specified time or times, in addition to other design objectives. The terminology "EOL" is not meant to suggest that the photovoltaic power system is not operational or does not produce power after the EOL time.

"Graded interlayer" (or "grading interlayer")—see "metamorphic layer".

"Inverted metamorphic multijunction solar cell" or "IMM solar cell" refers to a solar cell in which the subcells are deposited or grown on a substrate in a "reverse" sequence such that the higher band gap subcells, which would normally be the "top" subcells facing the solar radiation in the final deployment configuration, are deposited or grown on a growth substrate prior to depositing or growing the lower band gap subcells.

"Layer" refers to a relatively planar sheet or thickness of semiconductor or other material. The layer may be deposited or grown, e.g., by epitaxial or other techniques.

"Lattice mismatched" refers to two adjacently disposed materials or layers (with thicknesses of greater than 100 nm) having in-plane lattice constants of the materials in their fully relaxed state differing from one another by less than 0.02% in lattice constant. (Applicant expressly adopts this definition for the purpose of this disclosure, and notes that this definition is considerably more stringent than that proposed, for example, in U.S. Pat. No. 8,962,993, which suggests less than 0.6% lattice constant difference).

"Metamorphic layer" or "graded interlayer" refers to a layer that achieves a gradual transition in lattice constant generally throughout its thickness in a semiconductor structure.

"Middle subcell" refers to a subcell in a multijunction solar cell which is neither a Top Subcell (as defined herein) nor a Bottom Subcell (as defined herein).

"Multijunction solar cell" refers to a solar cell constituting an integral, monolithic crystalline semiconductor structure forming a photovoltaic semiconductor device, comprising a plurality of vertically arranged and adjacent photovoltaic junctions or subcells, in which the subcells are epitaxially grown using a reactor (such as a MOCVD reactor) on a bulk semiconductor substrate in a process sequence such that (a) in a "direct" growth process, the higher band gap subcells, which would normally be the "top" subcells facing the incoming light source radiation in the final deployment configuration, are deposited or grown on a growth substrate subsequent to depositing or growing the lower band gap subcells, or (b) in an "inverted" growth process, in a process sequence such that the higher band gap subcells are deposited or grown on the growth substrate prior to depositing or growing the lower band gap subcells. A mechanically "stacked" arrangement of discrete semiconductor "chips" each of which may constitute a discrete photovoltaic device and aligned and bonded together by an adhesive or similar material shall not be deemed a "multijunction solar cell" as that term is used by Applicant in the context of this disclosure.

"Short circuit current ($I_{sc}$)" refers to the amount of electrical current through a solar cell or solar subcell when the voltage across the solar cell is zero volts, as represented and measured, for example, in units of milliAmps (mA).

"Short circuit current density"—see "current density".

"Solar cell" refers to an electronic device operable to convert the energy of light directly into electricity by the photovoltaic effect.

"Solar cell assembly" refers to the combination of a solar cell together with one or more discrete optical, electrical, or mechanical (structural) subcomponents.

"Solar cell subassembly" refers to a subsect of a solar cell assembly, such as a solar cell together with only discrete electrical interconnects and/or coverglass attached to the solar cell.

"Solar subcell" refers to a sequence of layers composed of semiconductor materials including a p type base layer and an n+ type emitter layer forming a p-n photoactive junction. A solar subcell is designed to convert photons over a specific spectral or wavelength band to electrical current depending upon the band gap of the constituent semiconductor material. A solar subcell may compactly be referred to simply as a "junction", abbreviated "J". In that notation, the first subcell or junction may be referred to as the "1J" solar subcell, the second as the "2J", etc.

"Space qualified" refers to an electronic component (e.g., as used in this disclosure, to a solar cell) provides satisfactory operation under the high temperature and thermal cycling test protocols that establish typical "qualification" requirements for use by customers who utilize such components in the outer space environment. The exemplary conditions for such qualifications include (i) vacuum bake-out testing that includes exposure to a temperature of +100° C. to +135° C. (e.g., about +100° C., +110° C., +120° C., +125° C., +135° C.) for 2 hours to 24 hours, 48 hours, 72 hours, or 96 hours; and (ii) TVAC and/or APTC test that includes cycling between temperature extremes of −180° C. (e.g., about −180° C., −175° C., −170° C., −165° C., −150° C., −140° C., −128° C., −110° C., −100° C., −75° C., or −70° C.) to +145° C. (e.g., about +70° C., +80° C., +90° C., +100° C., +110° C., +120° C., +130° C., +135° C., or +145° C.) for 600 to 32,000 cycles (e.g., about 600, 700, 1500, 2000, 4000, 5000, 7500, 22000, 25000, or 32000 cycles), and in some space missions up to +180° C. See, for example, Fatemi et al., "Qualification and Production of Emcore ZTJ Solar Panels for Space Missions," Photovoltaic Specialists Conference (PVSC), 2013 IEEE 39th (DOI: 10.1109/PVSC 2013 6745052).

"Subcell"—see "Solar subcell".

"Substantially current matched" refers to the short circuit current through adjacent solar subcells being substantially identical (i.e. within plus or minus 1%).

"Top subcell" or "upper subcell" refers to the subcell in a multijunction solar cell which is closest to the primary light source for the solar cell.

"UMM" or "upright metamorphic multijunction solar cell" refers to a solar cell in which the subcells are deposited or grown on a substrate in a sequence such that the lower band gap subcells are deposited or grown on a growth substrate prior to depositing or growing the higher band gap subcells also including one or more metamorphic layers.

"Upright multijunction solar cell" refers to a solar cell in which the subcells are deposited or grown on a substrate in a sequence such that the lower band gap subcells are deposited or grown on a growth substrate prior to depositing or growing the higher band gap subcells.

"ZTJ" refers to the product designation of a commercially available SolAero Technologies Corp. triple junction solar cell.

DESCRIPTION OF THE PREFERRED EMBODIMENT

Details of the present invention will now be described including exemplary aspects and embodiments thereof. Referring to the drawings and the following description, like reference numbers are used to identify like or functionally similar elements, and are intended to illustrate major features of exemplary embodiments in a highly simplified diagrammatic manner. Moreover, the drawings are not intended to depict every feature of the actual embodiment nor the relative dimensions of the depicted elements, and are not drawn to scale.

The basic concept of fabricating an inverted metamorphic multijunction (IMM) solar cell is to grow the subcells of the solar cell on a substrate in a "reverse" sequence. That is, the high band gap subcells (i.e. subcells with band gaps in the range of 1.8 to 2.2 eV), which would normally be the "top" subcells facing the solar radiation, are grown epitaxially on a semiconductor growth substrate, such as for example GaAs or Ge, and such subcells are therefore lattice matched to such substrate. One or more lower band gap middle subcells (i.e. with band gaps in the range of 1.2 to 1.8 eV) can then be grown on the high band gap subcells.

At least one lower subcell is formed over the middle subcell such that the at least one lower subcell is substantially lattice mismatched with respect to the growth substrate and such that the at least one lower subcell has a third lower band gap (i.e. a band gap in the range of 0.7 to 1.2 eV). A surrogate substrate or support structure is then attached or provided over the "bottom" or substantially lattice mismatched lower subcell, and the growth semiconductor substrate is subsequently removed. (The growth substrate may then subsequently be re-used for the growth of a second and subsequent solar cells).

A variety of different features of inverted metamorphic multijunction solar cells are disclosed in the related applications noted above. Some, many or all of such features may be included in the structures and processes associated with the solar cells of the present disclosure. However, more particularly, the present disclosure is directed to the fabrication of an inverted metamorphic solar cell using either one, two or three different metamorphic layers, all grown on a single growth substrate with the window layer grown directly on the growth substrate (i.e., without the growth of discrete "contact" layers over the growth substrate). In the present disclosure, the resulting construction may include three, four, five, or six subcells, with band gaps in the range of 1.8 to 2.2 eV (or higher) for the top subcell, and 1.3 to 1.8 eV, 0.9 to 1.2 eV for the middle subcells, and 0.6 to 0.8 eV, for the bottom subcell, respectively.

It should be apparent to one skilled in the art that in addition to the one or two different metamorphic layers discussed in the present disclosure, additional types of semiconductor layers within the cell are also within the scope of the present disclosure.

The lattice constants and electrical properties of the layers in the semiconductor structure are preferably controlled by specification of appropriate reactor growth temperatures, flow rates, and times, and by use of appropriate chemical composition and dopants. The use of a vapor deposition method, such as Organo Metallic Vapor Phase Epitaxy (OMVPE), Metal Organic Chemical Vapor Deposition (MOCVD), Molecular Beam Epitaxy (MBE), or other vapor deposition methods for the reverse growth may enable the layers in the monolithic semiconductor structure forming the cell to be grown with the required thickness, elemental composition, dopant concentration and grading and conductivity type.

The present disclosure is directed to a growth process using a metal organic chemical vapor deposition (MOCVD) process in a standard, commercially available reactor suitable for high volume production. More particularly, the present disclosure is directed to the materials and fabrication steps that are particularly suitable for producing commercially viable (i.e., manufacturable with commercially acceptable yields) inverted metamorphic multijunction solar cells using commercially available equipment and established high-volume fabrication processes, as contrasted with merely academic expositions of laboratory or experimental results.

In order to provide appropriate background, FIGS. 1A through 1D depict the sequence of steps in forming an inverted metamorphic four junction solar cell generally as set forth in for example in U.S. patent application Ser. No. 12/271,192 filed Nov. 14, 2008, herein incorporated by reference.

FIG. 1A depicts the sequential formation of the four subcells A, B, C and D on a GaAs growth substrate. More particularly, there is shown a substrate 101, which is preferably gallium arsenide (GaAs), but may also be germanium (Ge) or other suitable material. For GaAs, the substrate is preferably a 15 degree off-cut substrate, that is to say, its surface is orientated 15 degree off the (100) plane towards the (111)A plane, as more fully described in U.S. patent application Ser. No. 12/047,944, filed Mar. 13, 2008.

In the case of a Ge substrate, a nucleation layer (not shown) is deposited directly on the substrate 101. On the substrate, or over the nucleation layer (in the case of a Ge substrate), a buffer layer 102 and an etch stop layer 103 are further deposited. In the case of GaAs substrate, the buffer layer 102 is preferably GaAs. In the case of Ge substrate, the buffer layer 102 is preferably GaInAs. A contact layer 104 of GaAs is then deposited on layer 103, and a window layer 105 of AlInP is deposited on the contact layer. The subcell A, consisting of an n+ emitter layer 106 and a p-type base layer 107, is then epitaxially deposited on the window layer 105. The subcell A is generally lattice matched to the growth substrate 101.

In one embodiment, the emitter layer 106 is composed of GaInP and the base layer 107 is composed of AlGaInP. In some embodiments, more generally, the base-emitter junction may be a heterojunction. In other embodiments, the base layer may be composed of (Al)GaInP, where the aluminum or Al term in parenthesis in the preceding formula means that Al is an optional constituent, and in this instance may be used in an amount ranging from 0% to 30%.

In some embodiments, the band gap of the base layer 107 is 1.91 eV or greater.

Subcell A will ultimately become the "top" subcell of the inverted metamorphic structure after completion of the process steps according to the present invention to be described hereinafter.

On top of the base layer 107 a back surface field ("BSF") layer 108 preferably p+AlGaInP is deposited and used to reduce recombination loss.

The BSF layer 108 drives minority carriers from the region near the base/BSF interface surface to minimize the effect of recombination loss. In other words, the BSF layer 18 reduces recombination loss at the backside of the solar subcell A and thereby reduces the recombination in the base.

On top of the BSF layer 108 a sequence of heavily doped p-type and n-type layers 109*a* and 109*b* is deposited that forms a tunnel diode, i.e. an ohmic circuit element that forms an electrical connection between subcell A to subcell B. Layer 109*a* is preferably composed of p++ AlGaAs, and layer 109*b* is preferably composed of n++ GaInP.

On top of the tunnel diode layers 109 a window layer 110 is deposited, preferably n+ GaInP. The advantage of utilizing GaInP as the material constituent of the window layer 110 is that it has an index of refraction that closely matches the adjacent emitter layer 111, as more fully described in U.S. patent application Ser. No. 12/258,190, filed Oct. 24, 2008. The window layer 110 used in the subcell B also operates to reduce the interface recombination loss. It should be apparent to one skilled in the art, that additional layer(s) may be added or deleted in the cell structure without departing from the scope of the present disclosure.

On top of the window layer 110 the layers of subcell B are deposited: the n-type emitter layer 111 and the p-type base layer 112. These layers are preferably composed of GaInP and $GaIn_{0.0015}As$ respectively (for a Ge substrate or growth template), or GaInP and GaAs respectively (for a GaAs substrate), although any other suitable materials consistent with lattice constant and band gap requirements may be used as well. Thus, subcell B may be composed of a GaAs, GaInP, GaInAs, GaAsSb, or GaInAsN emitter region and a GaAs, GaInAs, GaAsSb, or GaInAsN base region. The doping profile of layers 111 and 112 according to the present disclosure will be discussed in conjunction with FIG. 20B.

In some previously disclosed implementations of an inverted metamorphic solar cell, the middle cell was a homostructure. In some embodiments of the present disclosure, similarly to the structure disclosed in U.S. patent application Ser. No. 12/023,772, the middle subcell becomes a heterostructure with an GaInP emitter and its window is converted from AlInP to GaInP. This modification eliminated the refractive index discontinuity at the window/emitter interface of the middle subcell, as more fully described in U.S. patent application Ser. No. 12/258,190, filed Oct. 24, 2008. Moreover, the window layer 110 is preferably doped three times that of the emitter 111 to move the Fermi level up closer to the conduction band and therefore create band bending at the window/emitter interface which results in constraining the minority carriers to the emitter layer.

In one embodiment of the present disclosure, the middle subcell emitter has a band gap equal to the top subcell emitter, and the third subcell emitter has a band gap greater than the band gap of the base of the middle subcell. Therefore, after fabrication of the solar cell, and implementation and operation, neither the emitters of middle subcell B nor the third subcell C will be exposed to absorbable radiation. Substantially all of the photons representing absorbable radiation will be absorbed in the bases of cells B and C, which have narrower band gaps than the emitters. Therefore, the advantages of using heterojunction subcells are: (i) the short wavelength response for both subcells will improve, and (ii) the bulk of the radiation is more effectively absorbed and collected in the narrower band gap base. The effect will be to increase the short circuit current $J_{sc}$.

On top of the cell B is deposited a BSF layer 113 which performs the same function as the BSF layer 109. The p++/n++ tunnel diode layers 114*a* and 114*b* respectively are deposited over the BSF layer 113, similar to the layers 109*a* and 109*b*, forming an ohmic circuit element to connect subcell B to subcell C. The layer 114*a* may be composed of p++ AlGaAs, and layer 114*b* may be composed of n++ GaAs or GaInP.

In some embodiments, a threading dislocation inhibition (or "alpha") layer 115, composed of n-type InGa(A1)P of AlInP, is deposited over the tunnel diode 114*a*/114*b*, to a thickness in the range from 0.05 to 1.0 micron. Such threading dislocation inhibition layer is disposed directly adjacent to the subsequently deposited metamorphic layer. The threading dislocation inhibition layer is intended to prevent threading dislocations associated with the stresses introduced by the various lattice mismatched or grading layers within the metamorphic layer from propagating, either opposite to the direction of growth into the middle and top subcells B and A, respectively, or in the direction of growth into the subcell C. The performance improvement and other advantages of including such a distinct threading dislocation inhibition layer are more particularly described in copending U.S. patent application Ser. No. 11/860,183, filed Sep. 24, 2007. For convenience in labeling the layer in the drawings of the present application, we utilize the shorthand "alpha layer" but it is to be understood as a threading dislocation inhibition layer.

In that connection, it should be emphasized here that although the term "barrier layer" has previously been used by Applicants in the earlier U.S. patent application Ser. No. 11/860,183 for the instant "alpha" layer, and by other researchers in the published literature for a variety of sundry layers in a solar cell not serving the same purpose as the identified "alpha" layer in Applicant's solar cell, in the present application the identified alpha threading dislocation inhibition layer has a particular meaning that would be readily apparent to the person of ordinary skill in the field in view of structure of an upright or inverted metamorphic solar cell and the stresses introduced and propagated by the lattice mismatching of not only the adjacent subcells but also the sublayers within the graded metamorphic layer itself. By expressly identifying the layer as threading dislocation inhibition layer it is intended to avoid any ambiguity or unwarranted assumptions concerning the composition, function and/or effect of such layer. In particular, identifying such layer as a threading dislocation inhibition layer (or in shorthand adopted here as a distinct "alpha" layer) in this and previous applications, such nomenclature signifies that the threading dislocation inhibition layer has different physical properties (e.g., a different and distinct composition) from the directly adjacent layers. Thus, the introduction of the threading dislocation inhibition layer or "alpha" layer into a solar cell is a distinctive feature of U.S. patent application Ser. No. 11/860,183, and of the present disclosure. By placing such a layer in the designated position in the illustrated embodiments, the threading dislocation inhibition layer will have a function and effect which results in a demonstrable improvement in the ultimate performance, reliability, manufacturability, or other mechanical and processing related characteristics of the solar cell into which it is implemented.

In utilizing the terminology "different and distinct composition" in the preceding paragraph, and throughout this disclosure, we mean, most generally, a layer with different constituent elements, or the same constituent elements in different proportions or mole fractions (which would result in different lattice constants for the two materials), or the same constituent elements with different dopants, dopant concentrations, or dopant profiles such that the operational characteristics of the different layers are distinct and different.

A metamorphic layer (or graded interlayer) 116 is deposited over the alpha layer 115. Layer 116 is preferably a compositionally step-graded series of AlGaInAs layers, preferably with monotonically changing lattice constant, so as to achieve a gradual transition in lattice constant in the semiconductor structure from subcell B to subcell C while minimizing threading dislocations from occurring. In some embodiments, the band gap of layer 116 is constant throughout its thickness, preferably approximately equal to 1.5 eV, or otherwise consistent with a value slightly greater than the band gap of the middle subcell B. One embodiment of the graded interlayer may also be expressed as being composed of $(In_xGa_{1-x})_yAl_{1-y}As$, with x and y selected such that the band gap of the interlayer remains constant at approximately 1.50 eV or other appropriate band gap. In other embodiments, the graded interlayer is composed of $(In_xGa_{1-x})_yAl_{1-y}As$, with x and y selected such that the band gap of the interlayer remains substantially constant at 1.6 eV or approximately 1.6 eV (e.g., in the range of 1.55 eV to 1.65 eV).

In an alternative embodiment where the solar cell has only two subcells, and the "middle" cell B is the uppermost or top subcell in the final solar cell, wherein the "top" subcell B would typically have a band gap of 1.8 to 1.9 eV, then the band gap of the interlayer would remain constant at 1.9 eV.

In the inverted metamorphic structure described in the Wanlass et al. paper cited above, the metamorphic layer consists of nine compositionally graded GaInP steps, with each step layer having a thickness of 0.25 micron. As a result, each layer of Wanlass et al. has a different band gap. In one embodiment of the present invention, the layer 116 is composed of a plurality of layers of AlGaInAs, with monotonically changing lattice constant, each layer having the same band gap, approximately 1.5 eV. In some embodiments, the layer 116 is composed of a plurality of layers of AlGaInAs, with monotonically changing lattice constant, each layer having the same band gap, approximately 1.6 eV.

The advantage of utilizing a constant band gap material such as AlGaInAs is that arsenide-based semiconductor material is much easier to process from a manufacturing standpoint in standard commercial MOCVD reactors than materials incorporating phosphorus, while the small amount of aluminum in the band gap material assures radiation transparency of the metamorphic layers.

Although one embodiment of the present disclosure utilizes a plurality of layers of AlGaInAs for the metamorphic layer 116 for reasons of manufacturability and radiation transparency, other embodiments of the present disclosure may utilize different material systems to achieve a change in lattice constant from subcell B to subcell C. Other embodiments of the present disclosure may utilize continuously graded, as opposed to step graded, materials. More generally, the graded interlayer may be composed of any of the As, P, N, Sb based III-V compound semiconductors subject to the constraints of having the in-plane lattice parameter greater or equal to that of the second solar cell and less than or equal to that of the third solar cell, and having a band gap energy greater than that of the second solar cell.

In another embodiment of the present disclosure, an optional second alpha layer 117 may be deposited over the AlGaInAs metamorphic layer 116. The second alpha layer 117 will typically have a different composition than that of alpha layer 115, and performs essentially the same function of preventing threading dislocations from propagating. In one embodiment, alpha layer 117 is n+ type GaInP. Further, each barrier layer in this and other implementations described here, has a composition that differs from the composition of an adjacent graded interlayer and/or adjacent solar subcell layer.

A window layer 118 preferably composed of n+ type GaInP is then deposited over the barrier layer 117 (or directly over layer 116, in the absence of a second barrier layer). This window layer operates to reduce the recombination loss in subcell "C". It should be apparent to one skilled in the art that additional layers may be added or deleted in the cell structure without departing from the scope of the present disclosure.

On top of the window layer 118, the layers of the cell C are deposited: the n+ emitter layer 119, and the p-type base layer 120. These layers are preferably composed of n+ type GaInAs and p+ type GaInAs respectively, or n+ type GaInP and p type GaInAs for a heterojunction subcell, although other suitable materials consistent with lattice constant and band gap requirements may be used as well.

A BSF layer 121, preferably composed of AlGaInAs, is then deposited on top of the cell C, the BSF layer performing the same function as the BSF layers 108 and 113.

The p++/n++ tunnel diode layers **122*a* and 122*b* respectively are deposited over the BSF layer 121, similar to the layers 114*a* and 114*b*, forming an ohmic circuit element to connect subcell C to subcell D. The layer 122*a* is composed of p++ AlGaInAs, and layer 122*b*** is composed of n++ GaInP.

In some embodiments an "alpha" layer 123, preferably composed of n-type GaInP, is deposited over the tunnel diode **122*a*/122*b***, to a thickness of about 0.5 micron. Such alpha layer is intended to prevent threading dislocations from propagating, either opposite to the direction of growth into the top and middle subcells A, B and C, or in the direction of growth into the subcell D, and is more particularly described in copending U.S. patent application Ser. No. 11/860,183, filed Sep. 24, 2007.

A metamorphic layer (or graded interlayer) 124 is deposited over the alpha layer 123. Layer 124 is preferably a compositionally step-graded series of AlGaInAs layers, preferably with monotonically changing lattice constant, so as to achieve a gradual transition in lattice constant in the semiconductor structure from subcell C to subcell D while minimizing threading dislocations from occurring. In some embodiments the band gap of layer 124 is constant throughout its thickness, preferably approximately equal to 1.1 eV, or otherwise consistent with a value slightly greater than the band gap of the middle subcell C. One embodiment of the graded interlayer may also be expressed as being composed of $(In_xGa_{1-x})_yAl_{1-y}As$, with x and y selected such that the band gap of the interlayer remains constant at approximately 1.1 eV or other appropriate band gap. In some implementations, it is advantageous for the band gap of the first graded interlayer 116 to be substantially constant at approximately 1.6 eV and the band gap of the second graded interlayer 124 to be substantially constant at approximately 1.1 eV.

A window layer 125 preferably composed of n+ type AlGaInAs is then deposited over layer 124 (or over a second alpha layer, if there is one, disposed over layer 124). This window layer operates to reduce the recombination loss in the fourth subcell "D". It should be apparent to one skilled in the art that additional layers may be added or deleted in the cell structure without departing from the scope of the present invention.

On top of the window layer 125, the layers of cell D are deposited: the n+ emitter layer 126, and the p-type base layer 127. These layers are preferably composed of n+ type GaInAs and p type GaInAs respectively, although other suitable materials consistent with lattice constant and band gap requirements may be used as well. The doping profile of layers 126 and 127 will be discussed in connection with FIG. 20.

A BSF layer 128, preferably composed of p+ type AlGaInAs, is then deposited on top of the cell D, the BSF layer performing the same function as the BSF layers 108, 113 and 121.

Finally a high band gap contact layer 129, preferably composed of p++ type AlGaInAs, is deposited on the BSF layer 128.

The composition of this contact layer 129 located at the bottom (non-illuminated) side of the lowest band gap photovoltaic cell (i.e., subcell "D" in the depicted embodiment) in a multijunction photovoltaic cell, can be formulated to reduce absorption of the light that passes through the cell, so that (i) the backside ohmic metal contact layer below it (on the non-illuminated side) will also act as a mirror layer, and (ii) the contact layer doesn't have to be selectively etched off, to prevent absorption.

It should be apparent to one skilled in the art, that additional layer(s) may be added or deleted in the cell structure without departing from the scope of the present invention.

A metal contact layer 130 is deposited over the p+ semiconductor contact layer 129. The metal is typically the sequence of metal layers Ti/Au/Ag/Au.

Also, the metal contact scheme chosen is one that has a planar interface with the semiconductor, after heat treatment to activate the ohmic contact. This is done so that (1) a dielectric layer separating the metal from the semiconductor doesn't have to be deposited and selectively etched in the metal contact areas; and (2) the contact layer is specularly reflective over the wavelength range of interest.

Figure 1B:
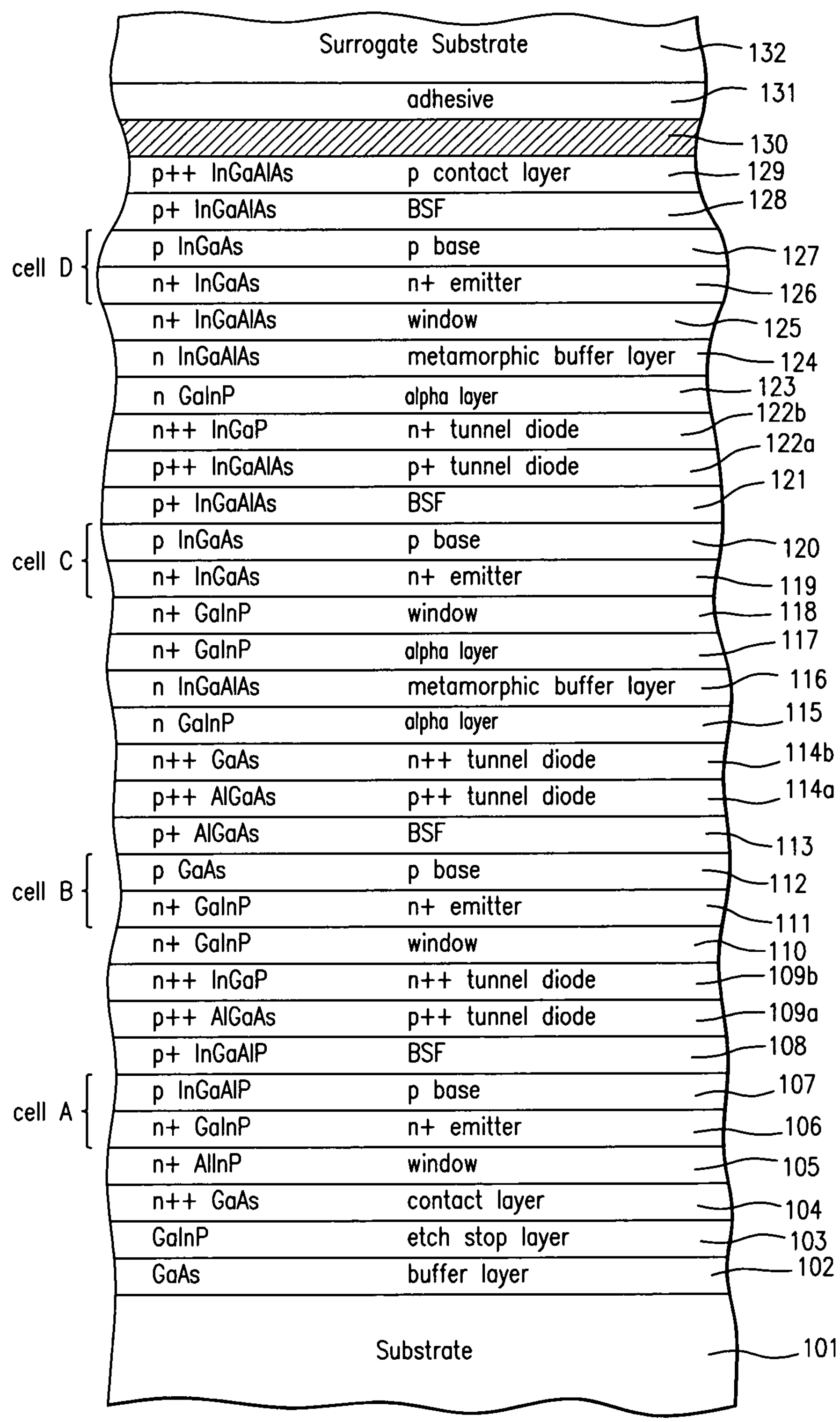
FIG. 1B is a cross-sectional view of the solar cell of FIG. 1A after the next process step in which a surrogate substrate is attached.

FIG. 1B is a cross-sectional view of the solar cell of FIG. 1A after the next process step in which an adhesive layer 131 is deposited over the metal layer 130. The adhesive may be CR 200 (manufactured by Brewer Science, Inc. of Rolla, Mo.).

In the next process step, a surrogate substrate 132, preferably glass or sapphire, is attached. Alternatively, the surrogate substrate may be GaAs, Ge or Si, or other suitable material. The surrogate substrate is about 40 mils in thickness, and in some embodiments, is perforated with holes about 1 mm in diameter, spaced 4 mm apart, to aid in subsequent removal of the adhesive and the substrate. Of course, surrogate substrates with other thicknesses and perforation configurations may be used as well. As an alternative to using an adhesive layer 131, a suitable substrate (e.g., GaAs) may be eutectically or permanently bonded to the metal layer 130.

Figure 1C:
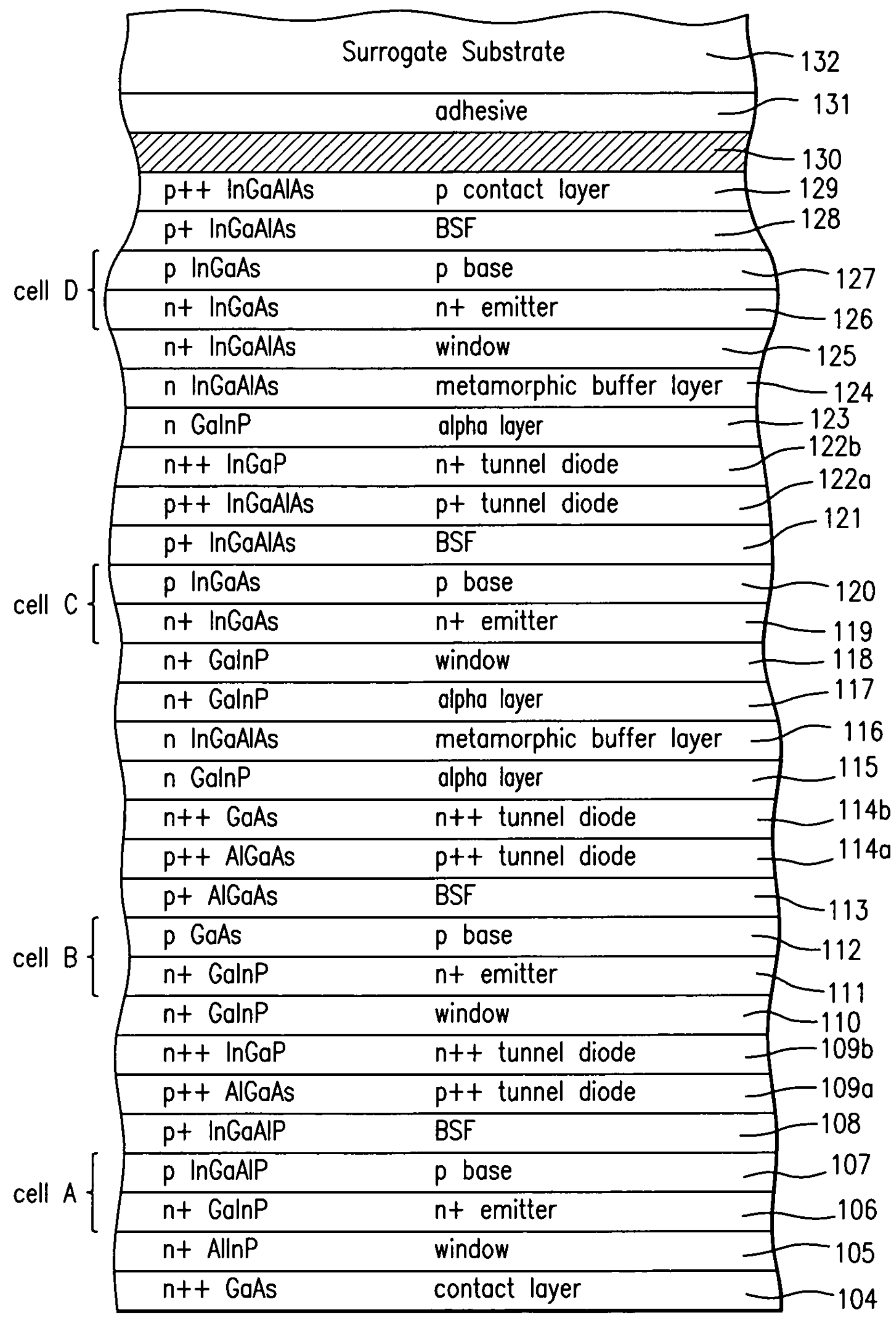
FIG. 1C is a cross-sectional view of the solar cell of FIG. 1B after the next process step in which the original substrate is removed.

FIG. 1C is a cross-sectional view of the solar cell of FIG. 1B after the next process step in which the original substrate is removed, in one embodiment, by a sequence of lapping and/or etching steps in which the substrate 101, and the buffer layer 103 are removed. The choice of a particular etchant is growth substrate dependent.

As described above, in some implementations, it is particularly advantageous for the band gap of the first graded interlayer 116 to be substantially constant at approximately 1.6 eV (i.e., 1.6 eV±3% or in the range of about 1.55 eV to 1.65 eV) and the band gap of the second graded interlayer 124 to be substantially constant at approximately 1.1 eV (i.e., in the range of 1.05 eV to 1.15 eV).

Four-junction IMM solar cell devices, each of which included two different graded interlayers, were fabricated by an IMM growth process. The devices included the following semiconductor layers deposited over one another: an upper solar subcell (A) of $GaInP_2$ having a band gap of 1.9 eV; a second solar subcell (B) of GaAs having a band gap of 1.41 eV; a first graded interlayer of InGaAlAs below the second subcell; a third solar subcell (C) of $In_{0.285}Ga_{0.715}As$ having a band gap of 1.02 eV; a second graded interlayer of InGaAlAs below the third subcell; and a lower solar subcell (D) of $In_{0.57}Ga_{0.43}As$ having a band gap of 0.67 eV. The devices included a GaAs substrate having a band gap of 1.41 eV. In each sample, the band gap of the first graded interlayer was substantially constant at about 1.4 eV, 1.5 eV or 1.6 eV, whereas the band gap of the second graded interlayer was substantially constant at about 1.0 eV, 1.1 eV or 1.2 eV. The higher band gap graded interlayer was disposed between the 1.41 eV and 1.02 eV junctions, and the lower band gap graded interlayer was disposed between the 1.02 eV and the 0.67 eV junctions. Solar cells with the following band gap combinations were processed into working devices:

| | Combination ID: | | | | | | | | |
|---|---|---|---|---|---|---|---|---|---|
| | 1 | 2 | 3 | 4 | 5 | 6 | 7 | 8 | 9 |
| Band gap (eV) of first grading interlayer: | 1.4 | 1.5 | 1.6 | 1.4 | 1.5 | 1.6 | 1.4 | 1.5 | 1.6 |

-continued

| | Combination ID: | | | | | | | | |
|---|---|---|---|---|---|---|---|---|---|
| | 1 | 2 | 3 | 4 | 5 | 6 | 7 | 8 | 9 |
| Band gap (eV) of second grading interlayer | 1.0 | 1.0 | 1.0 | 1.1 | 1.1 | 1.1 | 1.2 | 1.2 | 1.2 |

The performance of the cells was measured, and the cell conversion efficiency was calculated, as indicated by FIG. 26 in Applicant's U.S. Pat. No. 9,634,172.

The comparative test data of FIG. 26 in the U.S. Patent noted above indicate that the optimal combination of band gaps for the first and second graded interlayers occurs when the band gap of the first graded interlayer is in the range of about 1.5 eV-1.6 eV, and the band gap of the second graded interlayer is approximately 1.1 eV (i.e., combination IDs 5 and 6). These particular combination of band gaps provides a relatively large increase in conversion efficiency. This is advantageous, particularly in the field of solar cell devices in which even smaller improvements in conversion efficiency are typically considered significant. Of particular surprise is the significant improvement in conversion efficiency obtained for devices in which the first graded interlayer has a band gap of 1.6 eV and the second graded interlayer has a band gap of 1.1 eV. The combination of 1.6 eV and 1.1 eV band gaps for the graded interlayers can be advantageous for multi-junctions devices, including five-junction and six-junction devices as well as for three-junction and four-junction devices. In general, it can be advantageous for the first graded interlayer to have a band gap of 1.6 eV (±3%) and the second graded interlayer to have a band gap of 1.1 eV (±3%).

In some implementations, forming a particular one of the graded interlayers includes selecting an interlayer composed of InGaAlAs, and identifying a set of compositions of the formula $(In_xGa_{1-x})_yAl_{1-y}As$ defined by specific values of x and y, wherein $0<x<1$ and $0<y<1$, each composition having the same particular band gap (e.g., a particular value in the range 1.6 eV±3% eV for the first graded interlayer or a particular value in the range 1.1 eV+3% eV for the second graded interlayer). Forming a particular graded interlayer also can include identifying appropriate lattice constants for either side of the graded interlayer so that they match, respectively, the adjacent solar subcells. Forming a particular graded interlayer further can include identifying a subset of compositions of the formula $(In_xGa_{1-x})_yAl_{1-y}As$ having the particular band gap that are defined by specific values of x and y, wherein $0<x<1$ and $0<y<1$, wherein the subset of compositions have lattice constants ranging from the identified lattice constant that matches the solar subcell on one side of the graded interlayer to the identified lattice constant that matches the solar subcell on the opposing side of the graded interlayer.

In some instances, one or more of the steps can be performed by a computer program. For example, identifying a set of compositions of the formula $(In_xGa_{1-x})_yAl_{1-y}As$ defined by specific values of x and y, each composition having the same particular band gap (e.g., a particular value in the range 1.6 eV+3% eV), can include using a computer program. Likewise, identifying a subset of compositions of the formula $(In_xGa_{1-x})_yAl_{1-y}As$ having the particular band gap that are defined by specific values of x and y, wherein the subset of compositions have lattice constants ranging from the identified lattice constant that matches the solar subcell on one side of the graded interlayer to the identified lattice constant that matches the solar subcell on the opposing side of the graded interlayer, can include using a computer program.

The fabrication method can include precisely controlling and incrementally adjusting a mole fraction of each of In, Ga and Al to form a continuously graded interlayer as the first, second or other graded interlayer. Forming a particular one of the graded interlayers also can include providing a metal organic chemical vapor deposition (MOCVD) system configured to independently control the flow of source gases for gallium, indium, aluminum, and arsenic, and selecting a reaction time, a temperature and a flow rate for each source gas to form a continuously graded interlayer as the particular graded interlayer.

Figure 1D:
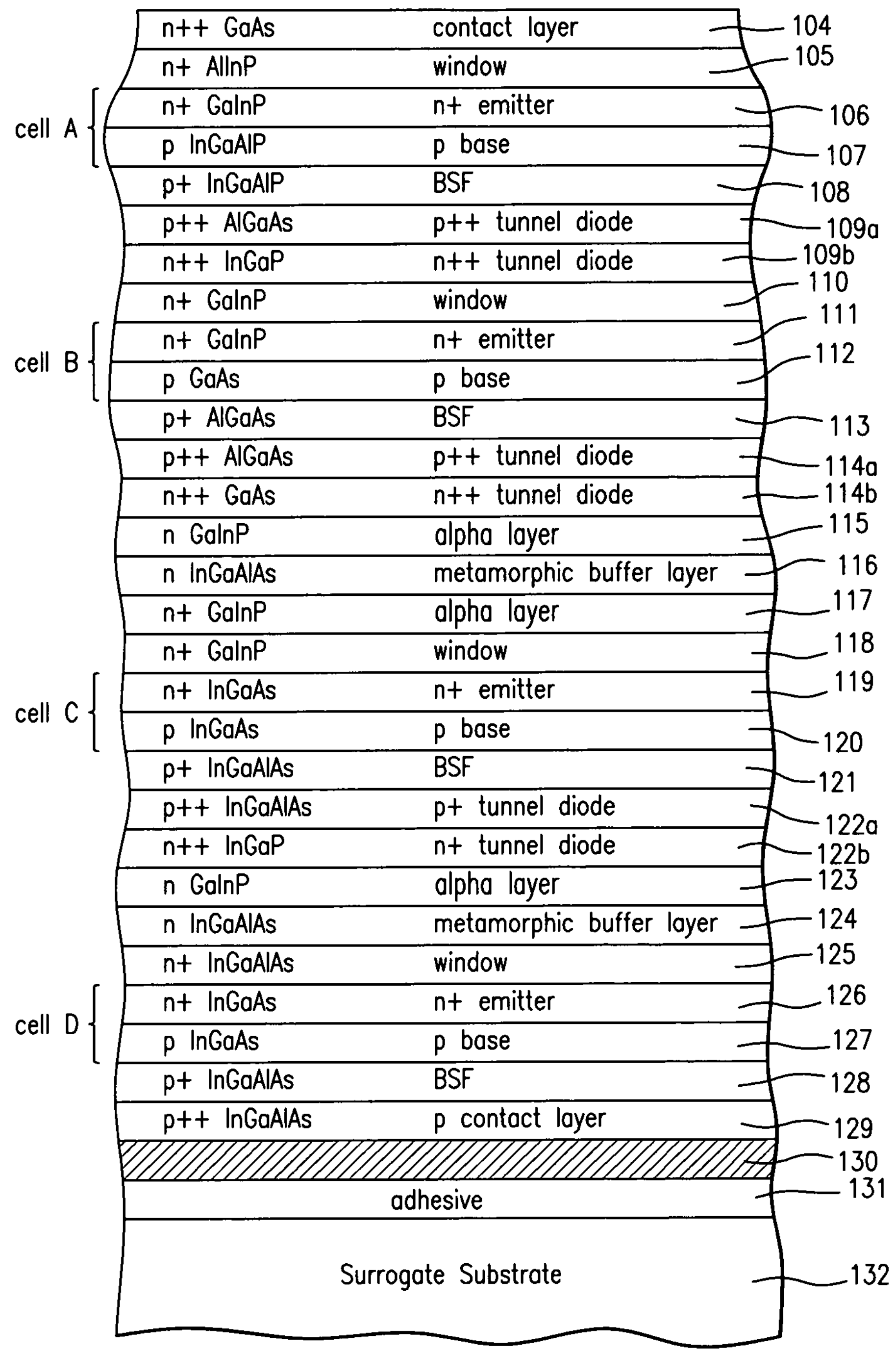
FIG. 1D is another cross-sectional view of the solar cell of FIG. 1C in a pictorial arrangement with the surrogate substrate on the bottom of the Figure.

FIG. 1D is a cross-sectional view of the solar cell of FIG. 1C with the orientation with the surrogate substrate 132 being at the bottom of the Figure. Subsequent Figures in this application will assume such orientation.

Figure 2A:
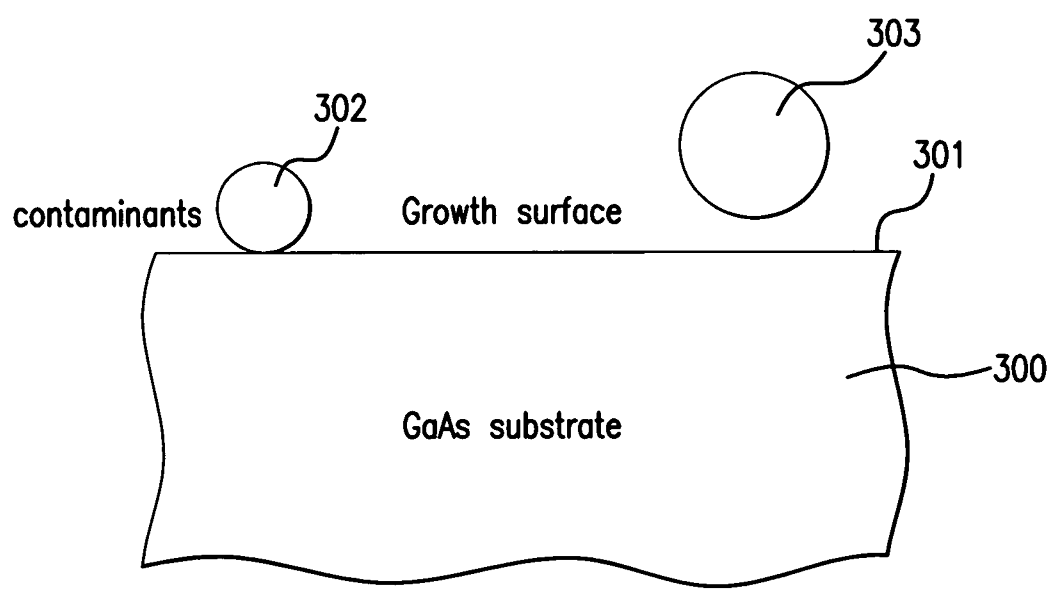
FIG. 2A is a highly simplified cross-sectional view of FIG. 1D depicting the presence of contaminants or defects on the surface of the growth substrate.

FIG. 2A is a highly simplified cross-sectional view of FIG. 1D depicting the presence of contaminants 302, 303 or defects on the surface 301 of the growth substrate 300. Such defects may arise from crystal discontinuities on the surface layer 301, gaps, cracks, or voids, contamination, or other sources.

Figure 2B:
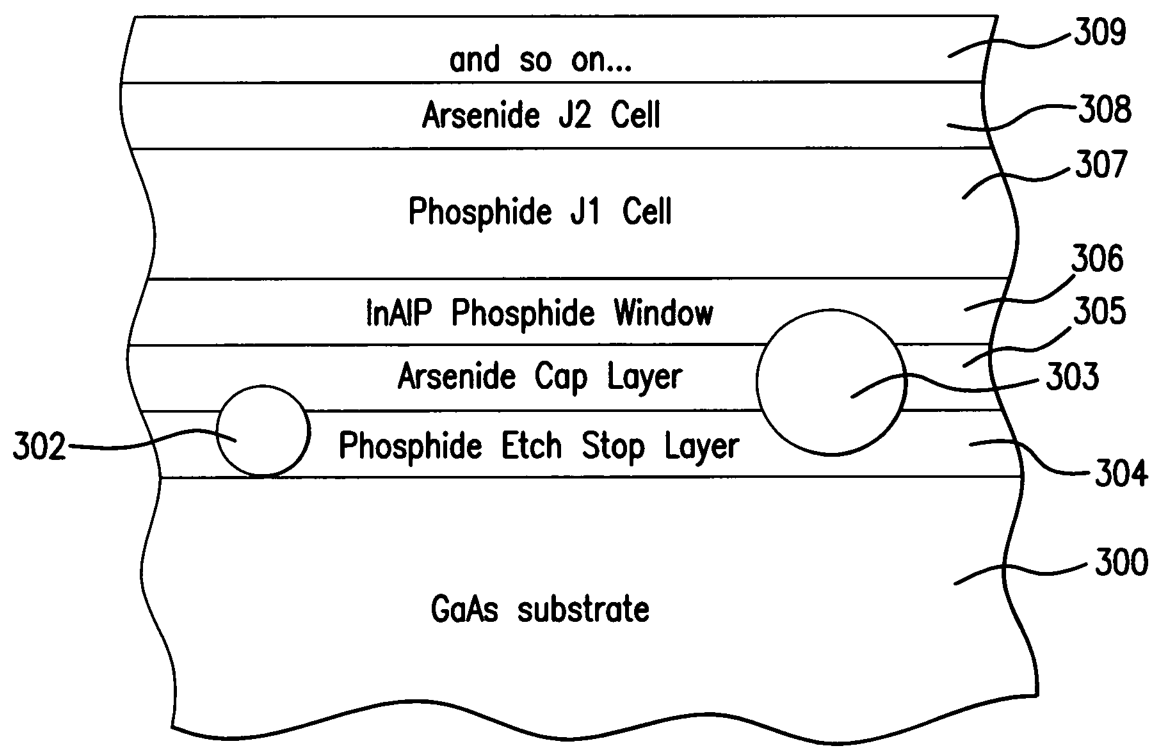
FIG. 2B is a cross-sectional view of the solar cell of FIG. 2A after the next sequence of process steps in which an etch stop, cap layer, window layer, and sequence of solar subcells are deposited.

FIG. 2B is a cross-sectional view of the solar cell of FIG. 2A after the next sequence of process steps in which an etch stop layer 304, cap layer 305, window layer 306, and sequence of solar subcells 307, 308, 309 . . . are deposited on the growth substrate 300.

Figure 2C:
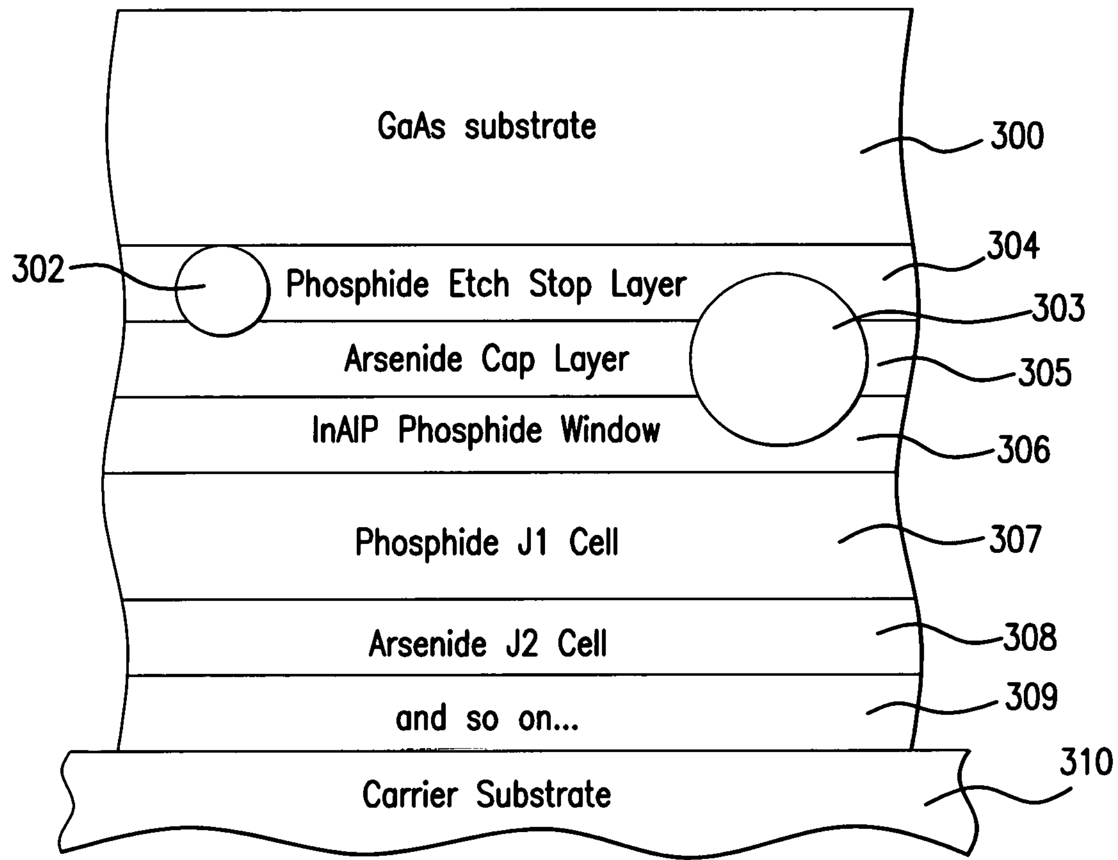
FIG. 2C is a cross-sectional view of the solar cell of FIG. 2B with the growth substrate depicted at the top of the Figure, and the sequence of solar cells mounted on a carrier substrate.

FIG. 2C is a cross-sectional view of the solar cell of FIG. 2B with the growth substrate 300 depicted at the top of the Figure, and the sequence of solar cells mounted on a carrier substrate 310, similar to the arrangement depicted in FIG. 1D.

Figure 2D:
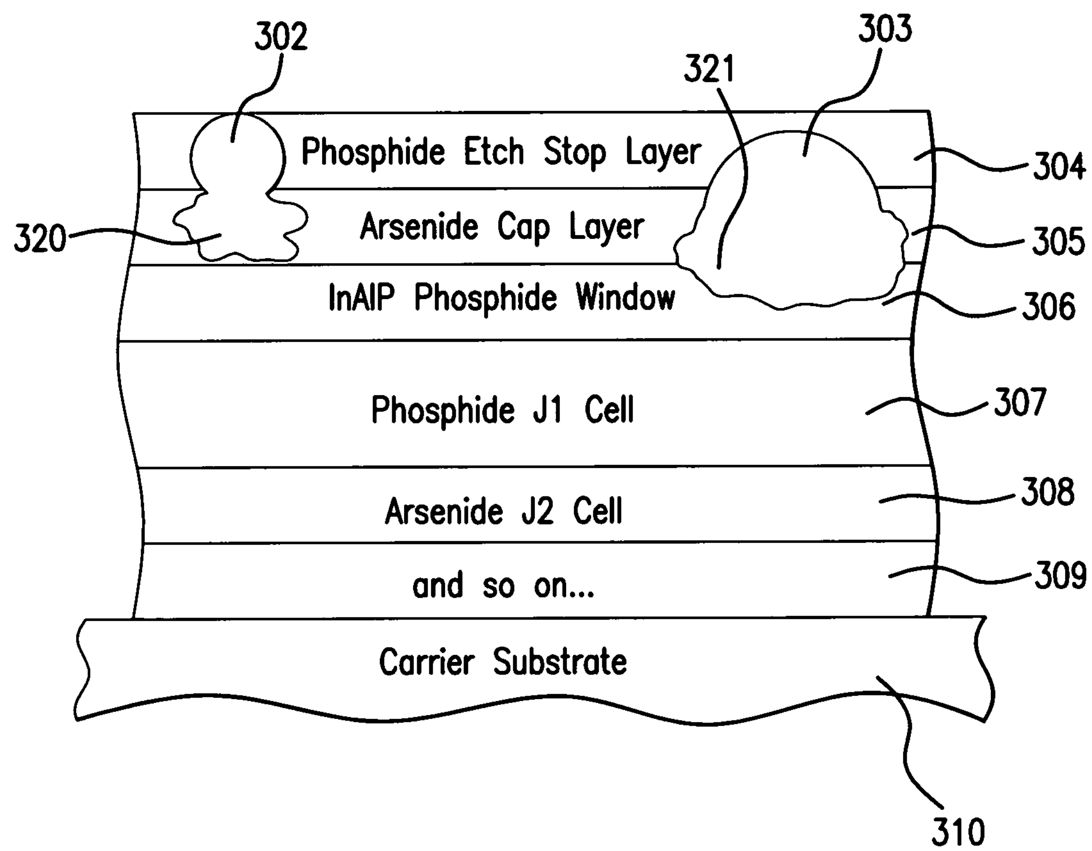
FIG. 2D is a cross-sectional view of the solar cell of FIG. 2C after removal of the growth substrate, and wet etching, causing the cap layer to be etched as well.

FIG. 2D is a cross-sectional view of the solar cell of FIG. 2C after removal of the growth substrate 300, and wet etching, causing the cap layer 305 to be etched as well, with the defects or voids 302, 303 now expanding and extending into regions 320 and 321 in the cap layer 305.

Figure 2E:
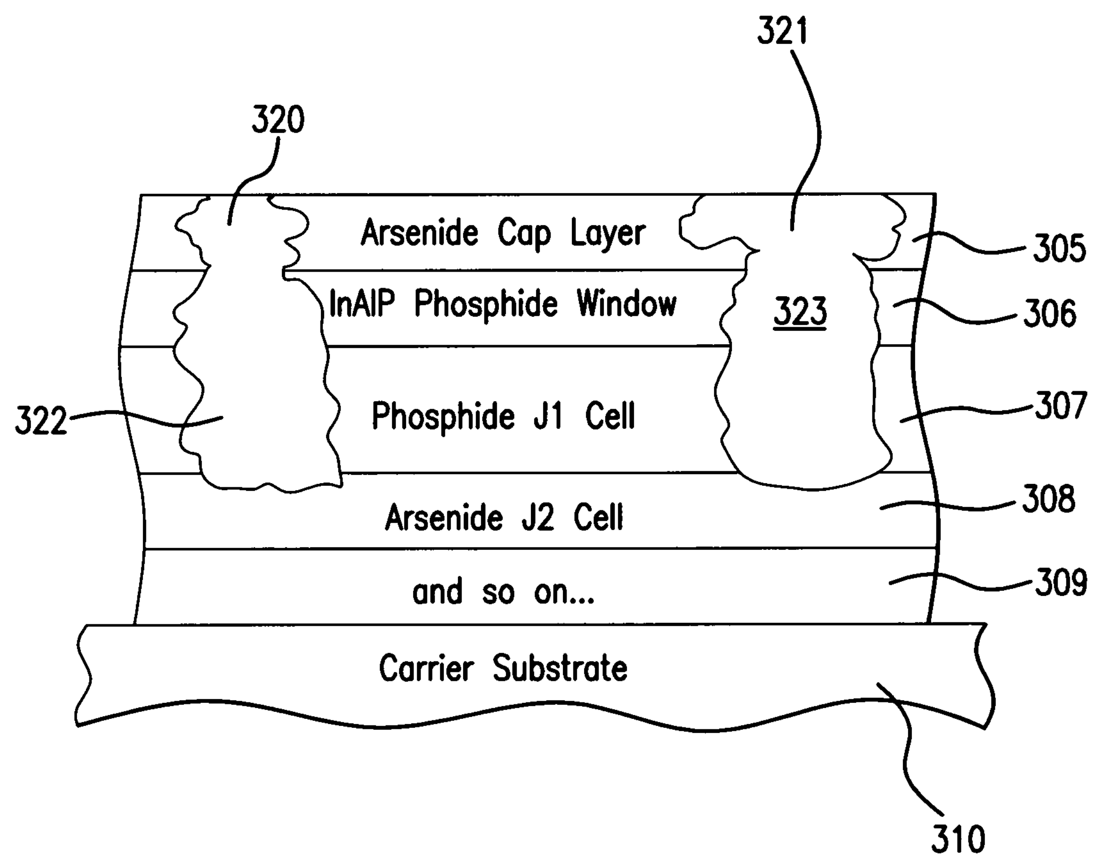
FIG. 2E is a cross-sectional view of the solar cell of FIG. 2D after removal of the etch stop layer.

FIG. 2E is a cross-sectional view of the solar cell of FIG. 2D after removal of the etch stop layer 304, with the defects 320 and 321 now propagating further into the window layer in regions 322 and 323 respectively.

Figure 2F:
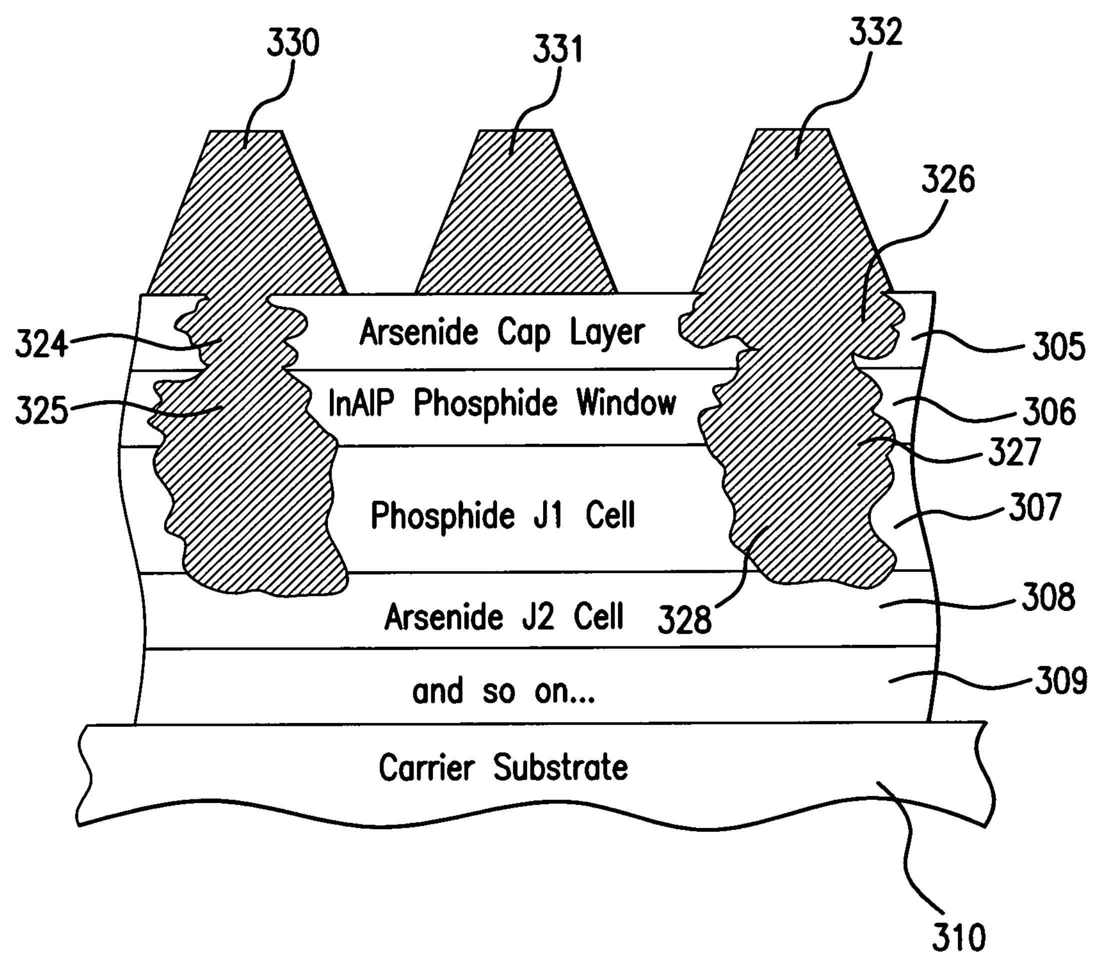
FIG. 2F is a cross-sectional view of the solar cell of FIG. 2E after metal deposition and lithography to form the grid lines, depicting penetration of the grid metallization into the cap and window layers.

FIG. 2F is a cross-sectional view of the solar cell of FIG. 2E after metal deposition and lithography to form the grid lines 330, 331 and 332, depicting penetration of the grid metallization into the cap and window layers into regions 324, 325, 326, 327 and 328.

Figure 2G:
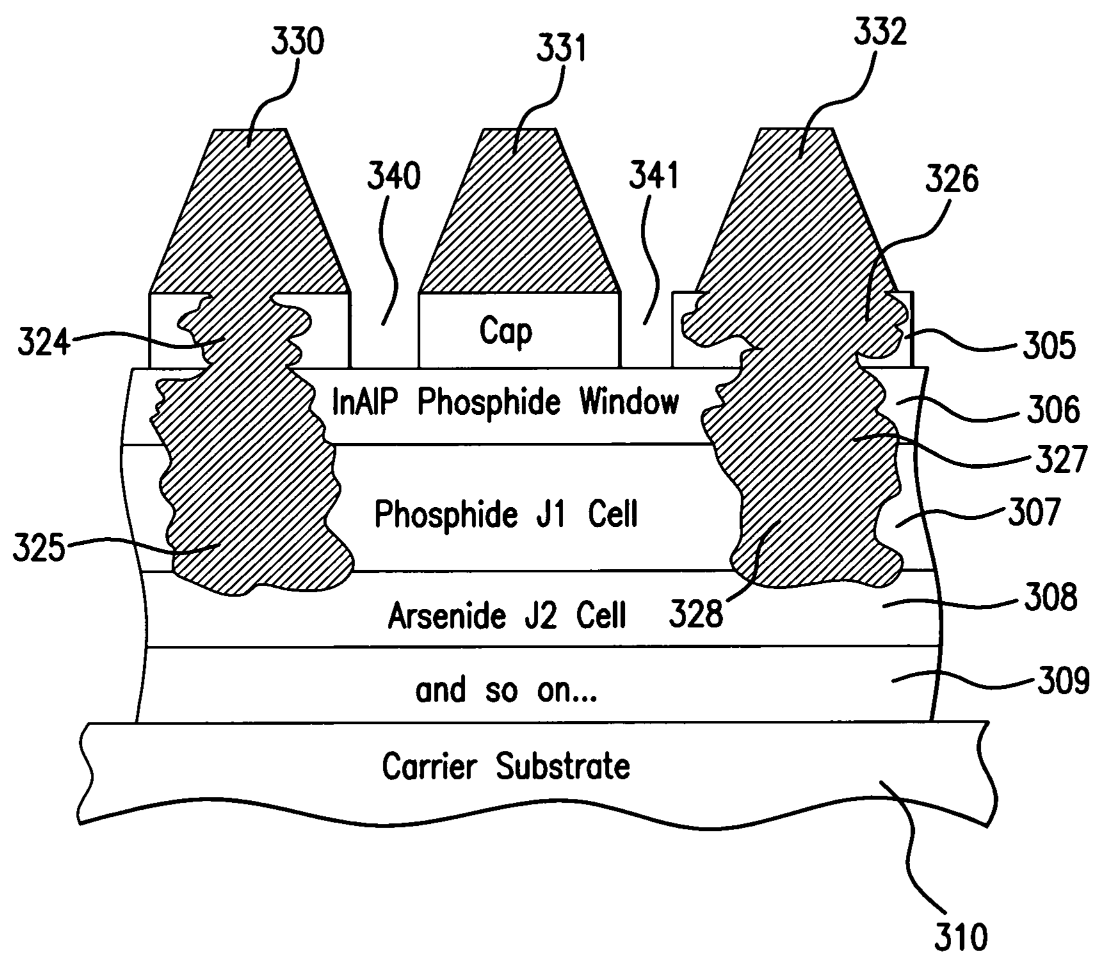
FIG. 2G is a cross-sectional view of the solar cell of FIG. 2F after etching down the cap layer to the window layer.

FIG. 2G is a cross-sectional view of the solar cell of FIG. 2F after etching down the cap layer 305 to the surface of the window layer 306.

Figure 3A:
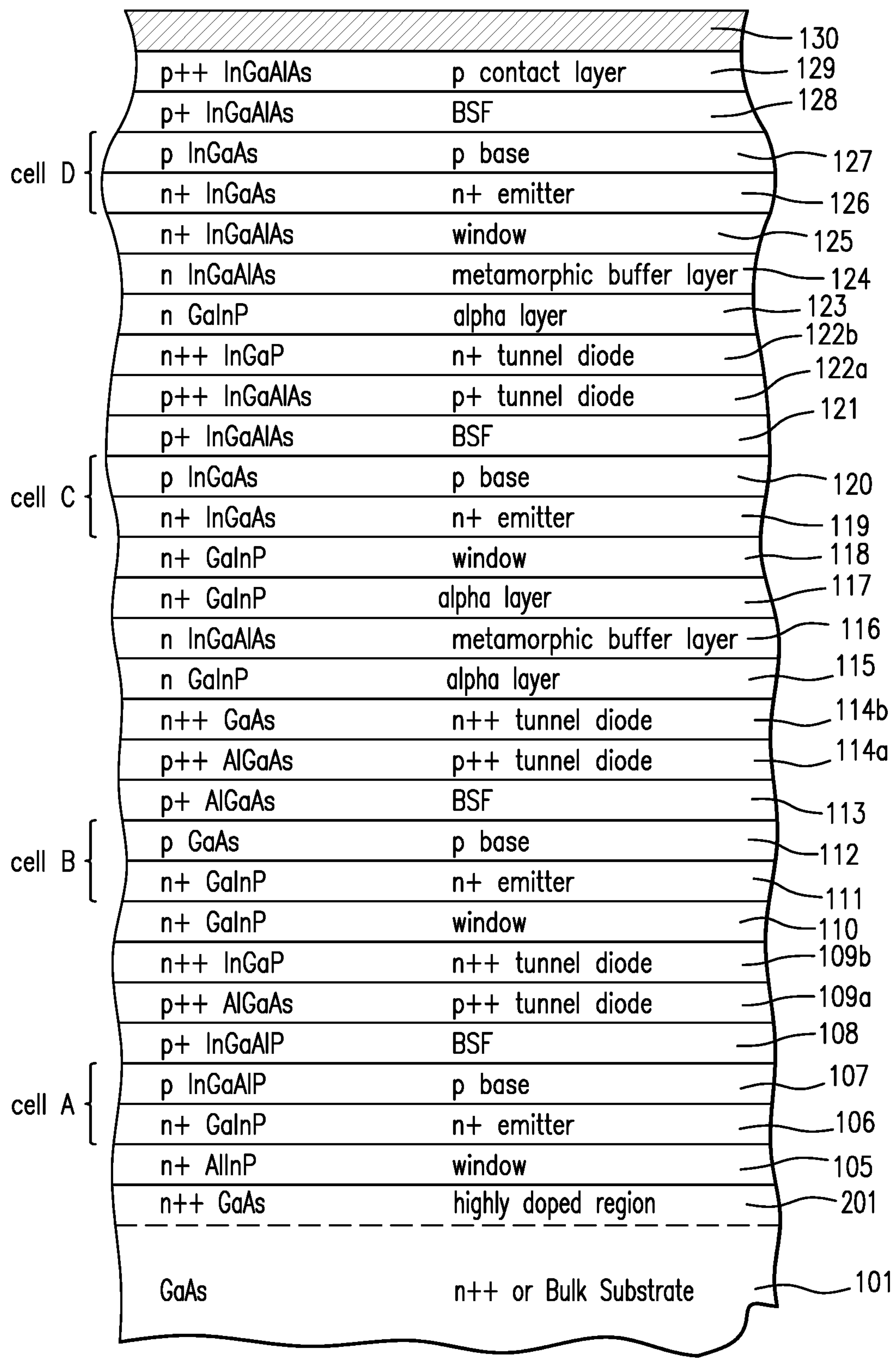
FIG. 3A is a cross-sectional view of the solar cell of one embodiment of a multijunction solar cell according to the present disclosure after an initial stage of fabrication including the deposition of certain semiconductor layers on the growth substrate.

FIG. 3A is a cross-sectional view of the solar cell of one embodiment of a multijunction solar cell according to the present disclosure after an initial stage of fabrication including the deposition of certain semiconductor layers on the growth substrate.

FIG. 3A depicts the sequential formation of the four subcells A, B, C and D on a GaAs growth substrate according to the present disclosure. More particularly, there is shown a substrate 101, which may be an undoped, or a p type or n type bulk gallium arsenide (GaAs) semiconductor substrate. For GaAs, the substrate is preferably a 15 degree off-cut substrate, that is to say, its surface is orientated 15 degrees off the (100) plane towards the (111)A plane, as more fully described in U.S. patent application Ser. No. 12/047,944, filed Mar. 13, 2008.

In some embodiments, the top portion of the substrate 101 is doped to a level of $1.0\times10^{18}$ to $1.0\times10^{20}$ charge carriers/$cm^3$, making an n++ GaAs layer 201, having a thickness from 0.5 μm to 10 μm. The formation of the n++ layer 201 may be done in situ, i.e. in the reactor during the epitaxial growth process, for example, by introducing a gas containing the dopant atoms after introduction of the substrates in the reactor, thereby doping the surface of the substrate. Alternatively, the growth substrate may be processed prior to introducing it in the reactor by ion-implementation, diffusion, or other technique to create the n++ layer 201.

In some embodiments, a buffer layer composed of GaAs may be deposited over the n++ layer 201 with a thickness between 500 nm and 1000 nm.

A window layer 105 of AlInP is deposited on the highly doped region or layer 201. The subcell A, consisting of an n+ emitter layer 106 and a p-type base layer 107, is then epitaxially deposited on the window layer 105. The subcell A is generally lattice matched to the growth substrate 101. The layers 105 through 130 in FIG. 3A are substantially identical to those described in connection with FIG. 1A, and therefore in the interest of brevity such descriptions will not be repeated here.

It should be noted that the multijunction solar cell structure could be formed by any suitable combination of group III to V elements listed in the periodic table subject to lattice constant and band gap requirements, wherein the group III includes boron (B), aluminum (Al), gallium (Ga), indium (In), and thallium (T). The group IV includes carbon (C), silicon (Si), germanium (Ge), and tin (Sn). The group V includes nitrogen (N), phosphorus (P), arsenic (As), antimony (Sb), and bismuth (Bi).

Figure 3B:
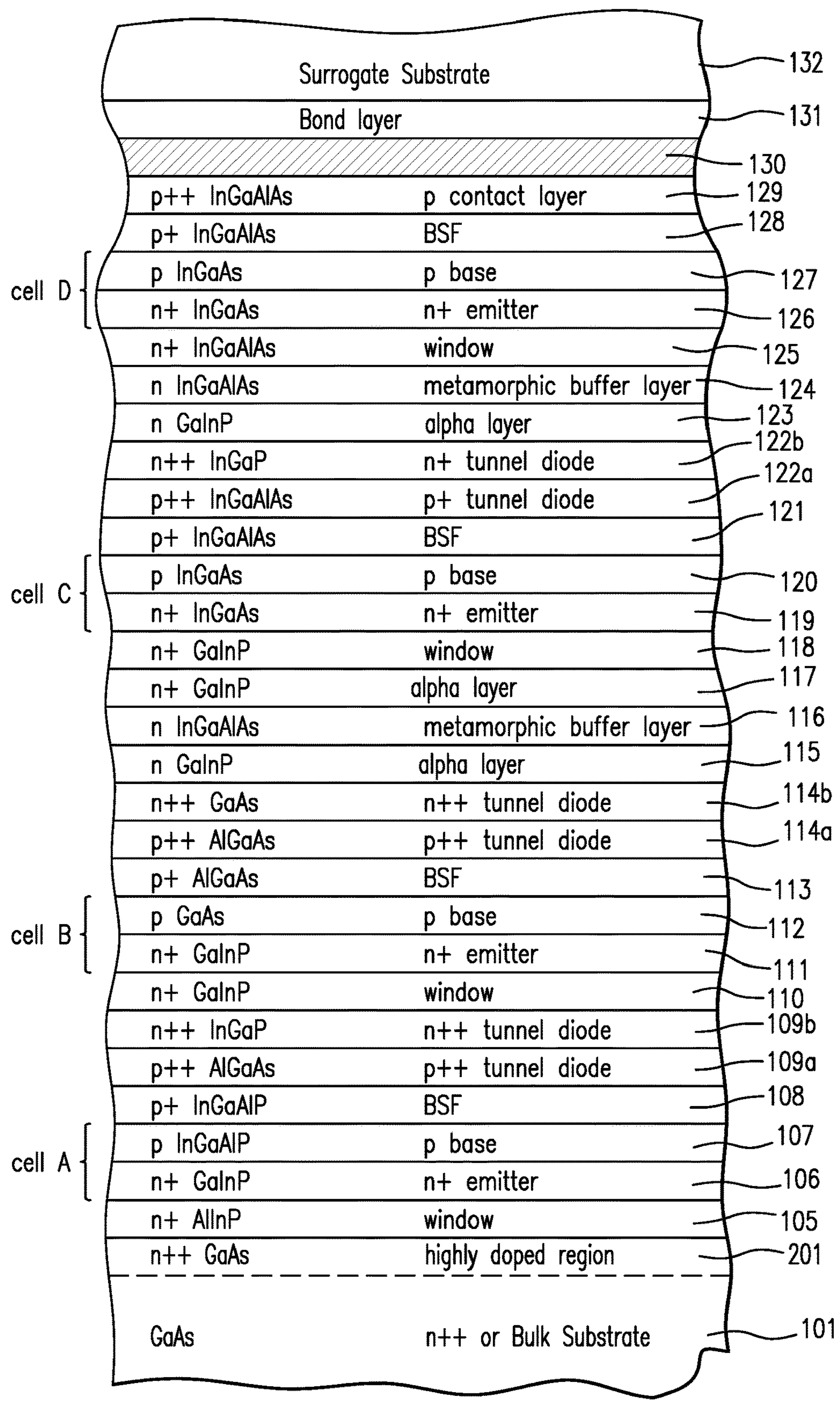
FIG. 3B is a cross-sectional view of the solar cell of FIG. 3A after the next process step in which a surrogate substrate is attached.

FIG. 3B is a cross-sectional view of the solar cell of FIG. 3A after the next process step in which a surrogate substrate 132 is attached similar to that of FIG. 1B.

Figure 3C:
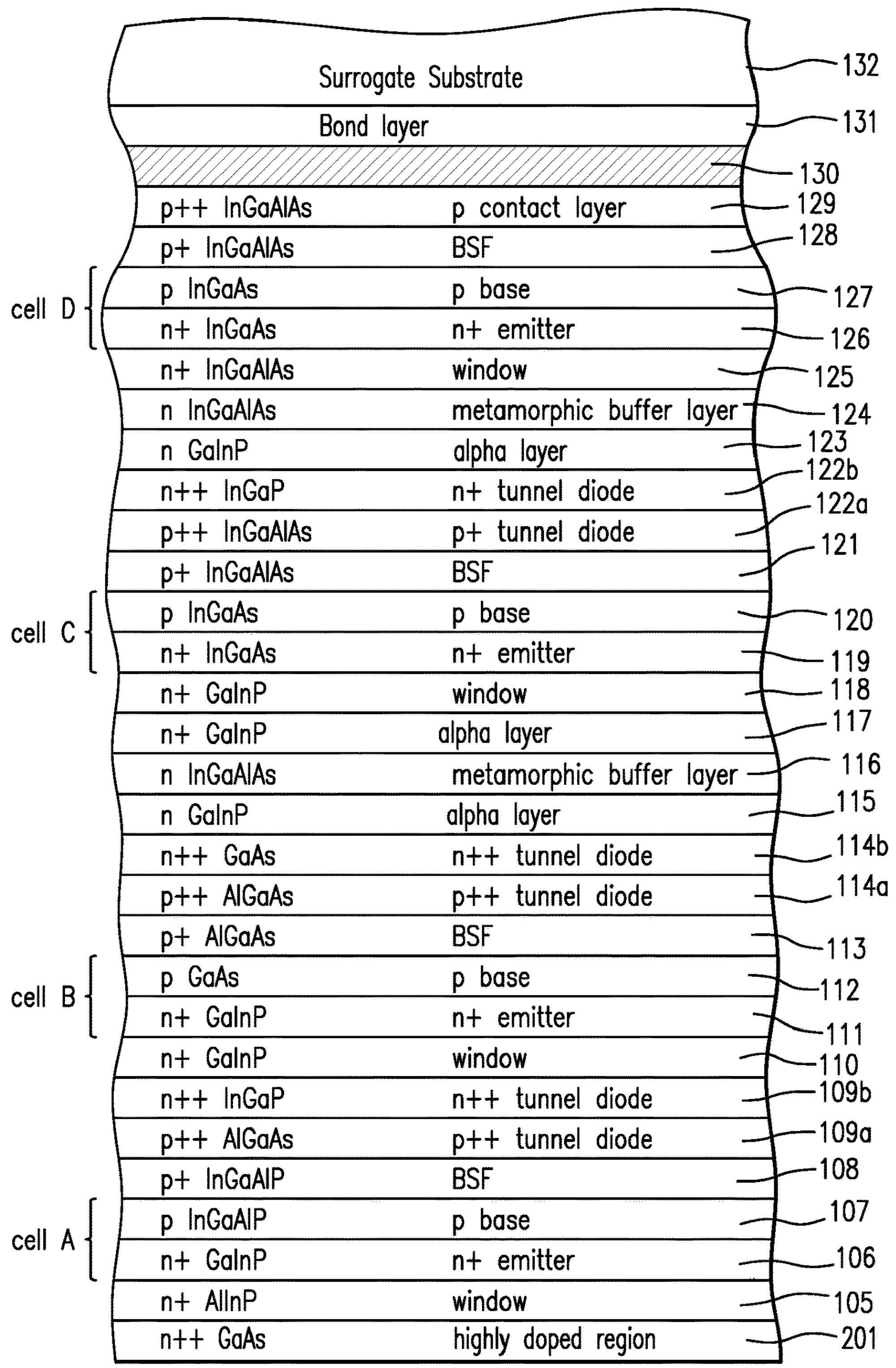
FIG. 3C is a cross-sectional view of the solar cell of FIG. 1B after the next process step in which a substantial portion of the original substrate is removed, leaving only a highly doped region or surface layer.

FIG. 3C is a cross-sectional view of the solar cell of FIG. 3B after the next process step in which a substantial portion 101 of the original substrate is removed, leaving only a highly doped region or surface layer 201, by grinding, polishing, lapping, etching, or a combination thereof.

Figure 4A:
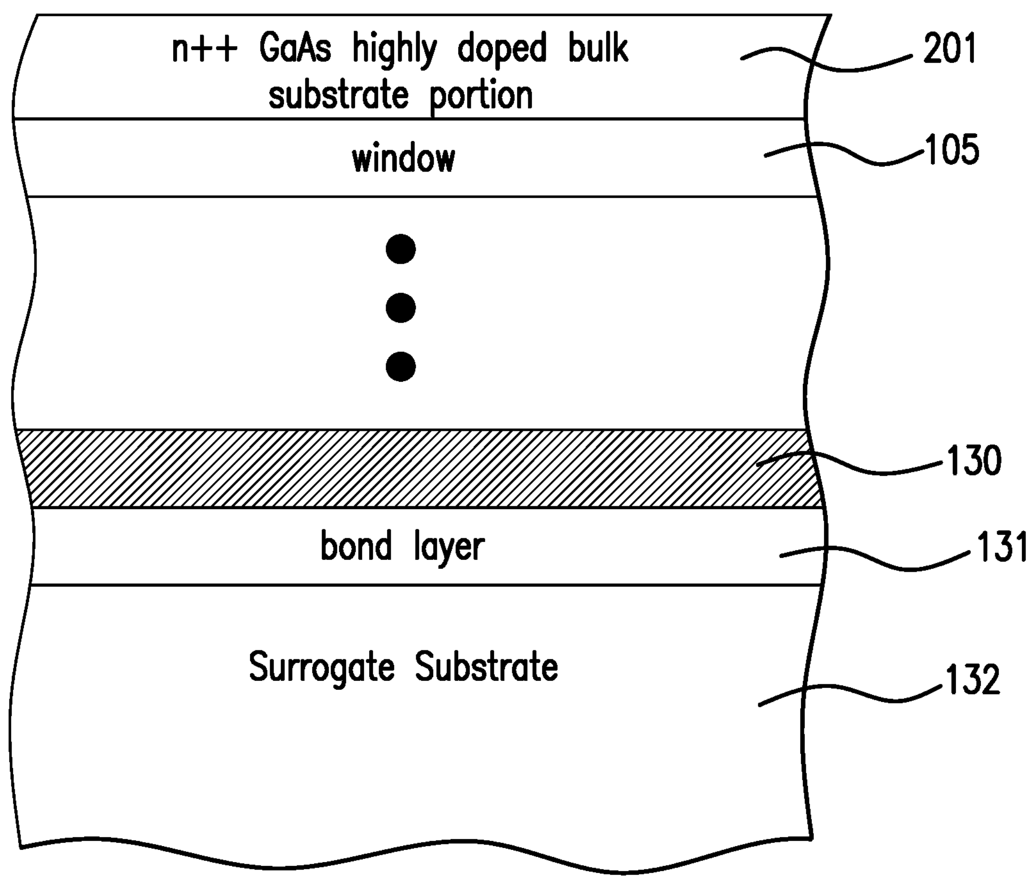
FIG. 4A is a highly simplified cross-sectional view of the solar cell of FIG. 3C in a pictorial arrangement with the surrogate substrate on the bottom of the Figure.

FIG. 4A is a highly simplified cross-sectional view of the solar cell of FIG. 3C in a pictorial arrangement with the surrogate substrate 132 on the bottom of the Figure.

Figure 4B:
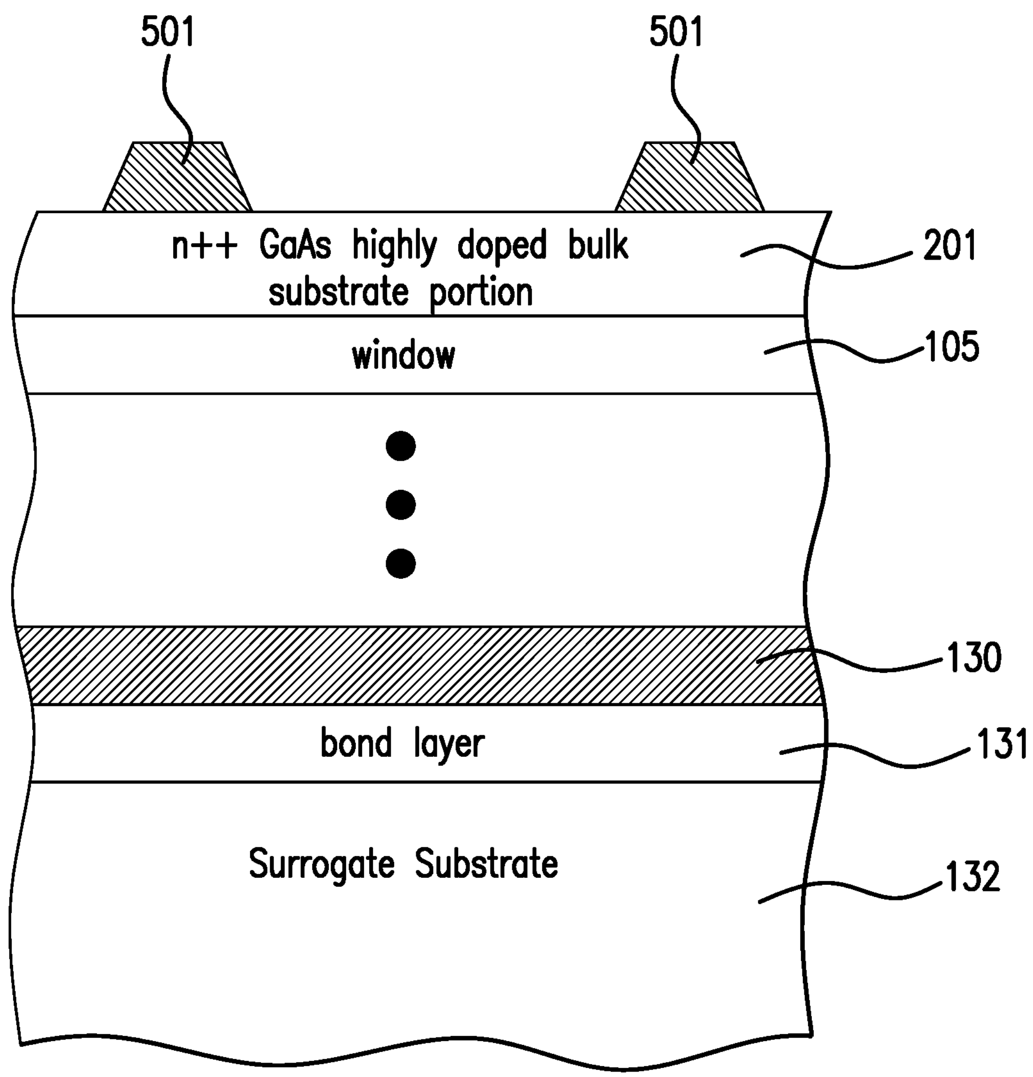
FIG. 4B is a cross-sectional view of the solar cell of FIG. 4A after the next sequence of process steps in which the grid lines are deposited.

FIG. 4B is a cross-sectional view of the solar cell of FIG. 4A after the next sequence of process steps in which the grid lines 501 are deposited on the top surface of the surface layer 201.

Figure 4C:
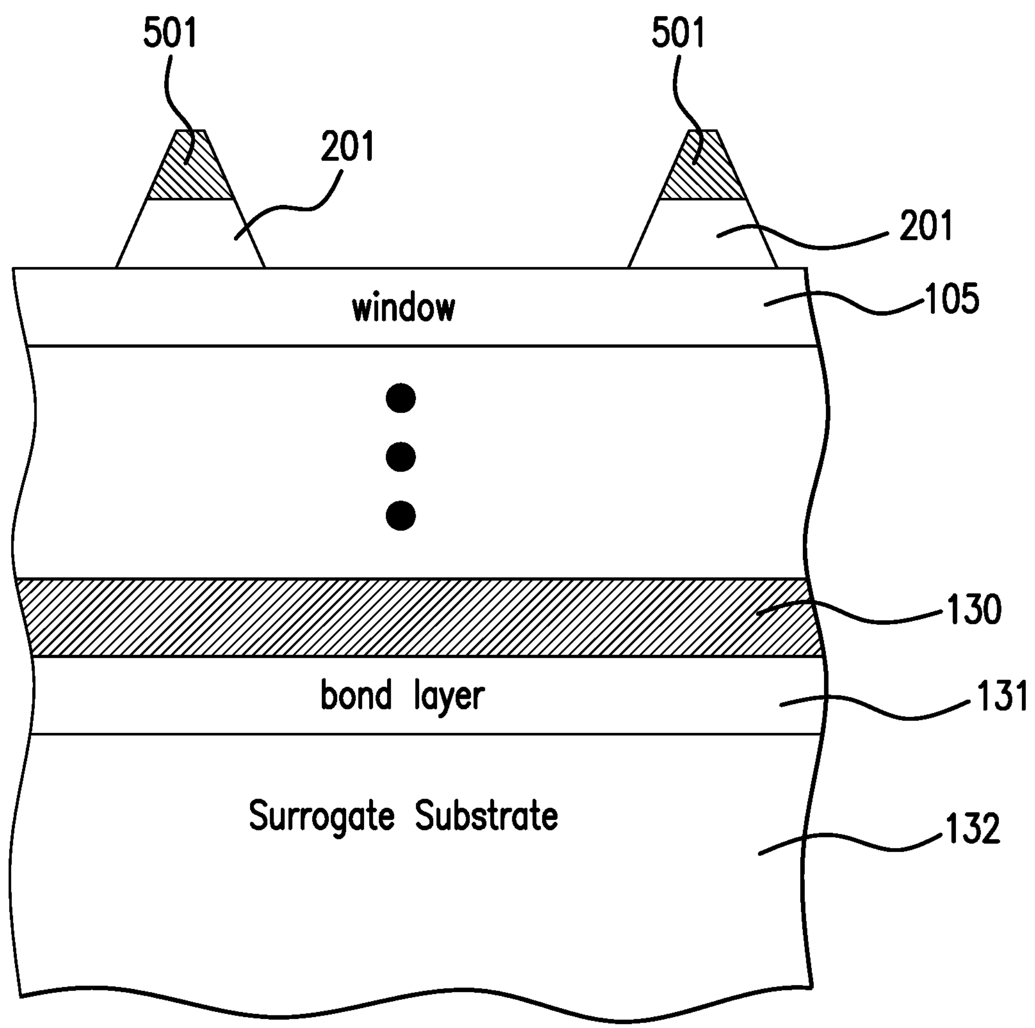
FIG. 4C is a cross-sectional view of the solar cell of FIG. 4B after portions of the highly doped surface layer are removed using the grid lines as a mask.

FIG. 4C is a cross-sectional view of the solar cell of FIG. 4B after portions of the highly doped surface layer 201 are removed using the grid lines 501 as a mask so that the surface of the window layer 105 is exposed.

FIGS. 5A through 5D depict the fabrication process according to the present disclosure including the presence of contaminants 302, 303 on the surface of the growth substrate 201.

Figure 5A:
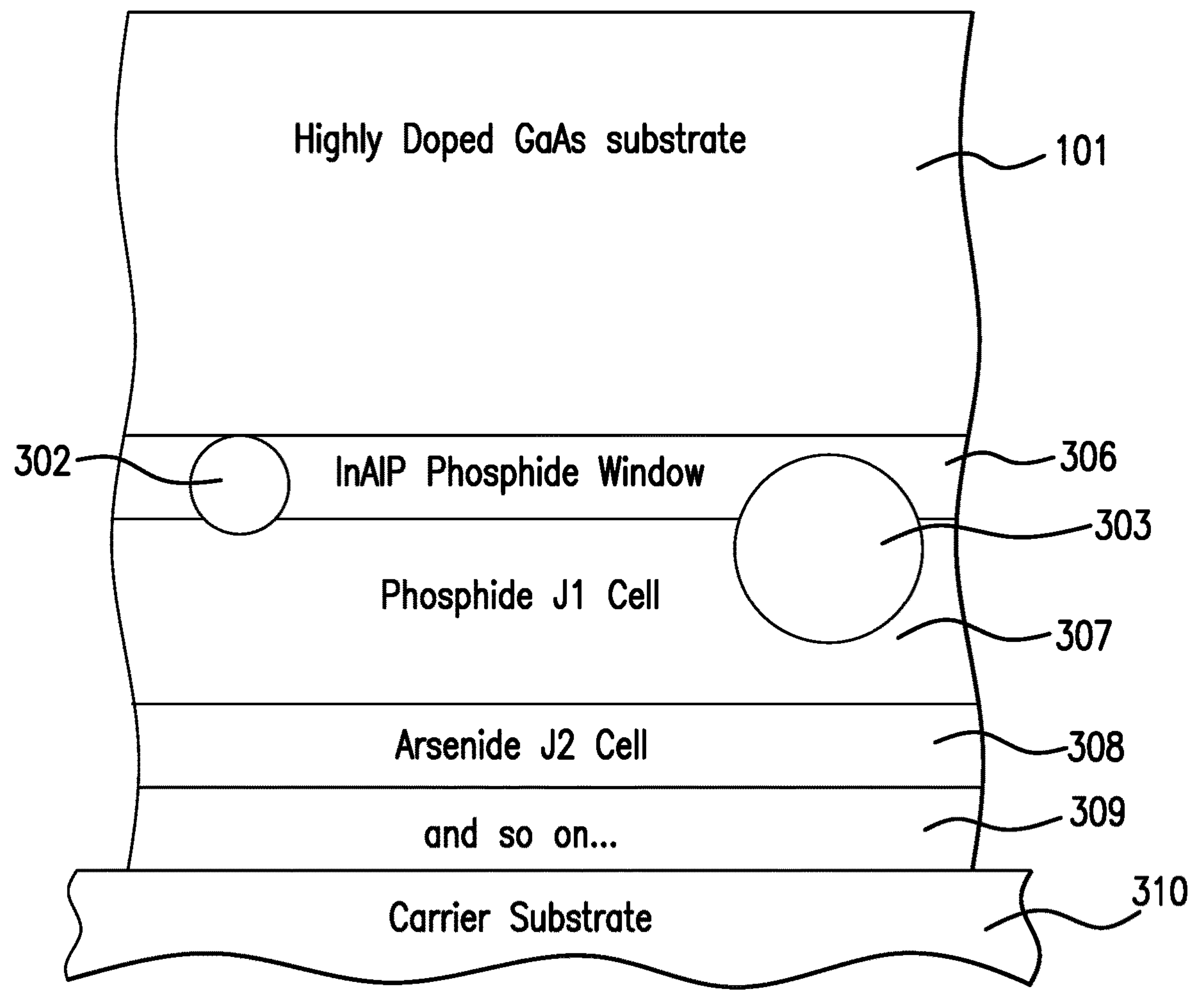
FIG. 5A is a highly simplified cross-sectional view of FIG. 4A according to the present disclosure depicting the presence of contaminants on the surface of the growth substrate.

FIG. 5A is a highly simplified cross-sectional view of FIG. 4A according to the present disclosure depicting the presence of contaminants 302, 303 or defects on the surface 301 of the growth substrate 201. Such defects may arise from crystal discontinuities on the surface layer, gaps, cracks, or voids, contamination, or other sources.

Figure 5B:
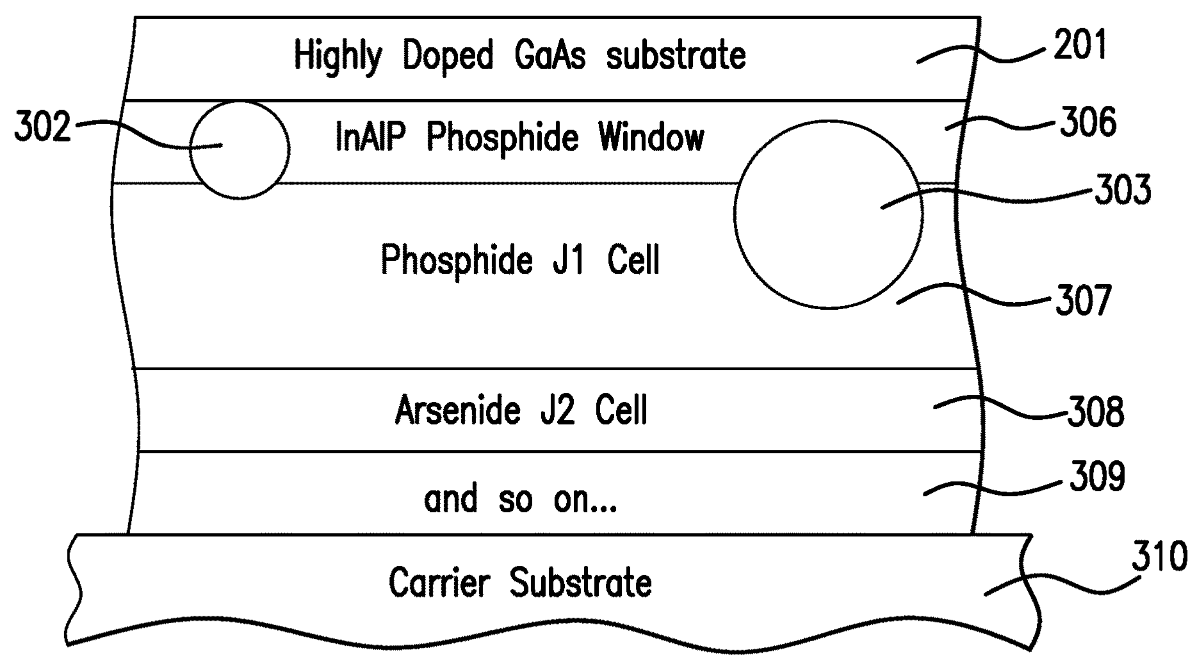
FIG. 5B is a cross-sectional view of the solar cell of FIG. 5A after the next sequence of process steps in which the substrate has been grinded, lapped, etched or otherwise reduced to a relatively thin layer.

FIG. 5B is a cross-sectional view of the solar cell of FIG. 5A after the next sequence of process steps in which the substrate 300 has been grinded, lapped, etched or otherwise reduced to a relatively thin layer 201.

Figure 5C:
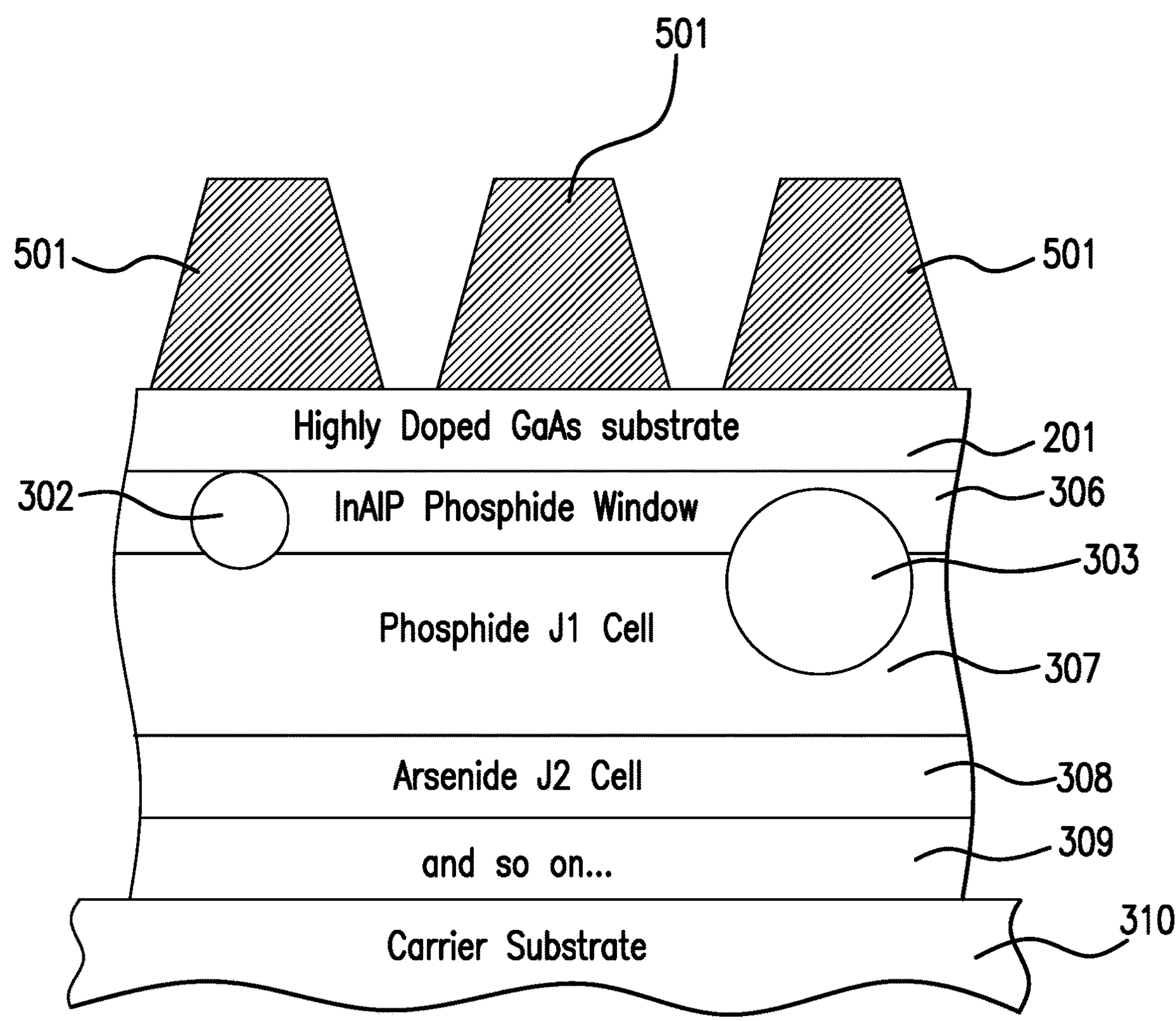
FIG. 5C is a cross-sectional view of the solar cell of FIG. 5B after metal deposition and lithography to form the grid lines.

FIG. 5C is a cross-sectional view of the solar cell of FIG. 5B after metal deposition and lithography to form the grid lines 330, 331 and 332, noting there is no penetration of the grid metallization into the substrate or window layers.

Figure 5D:
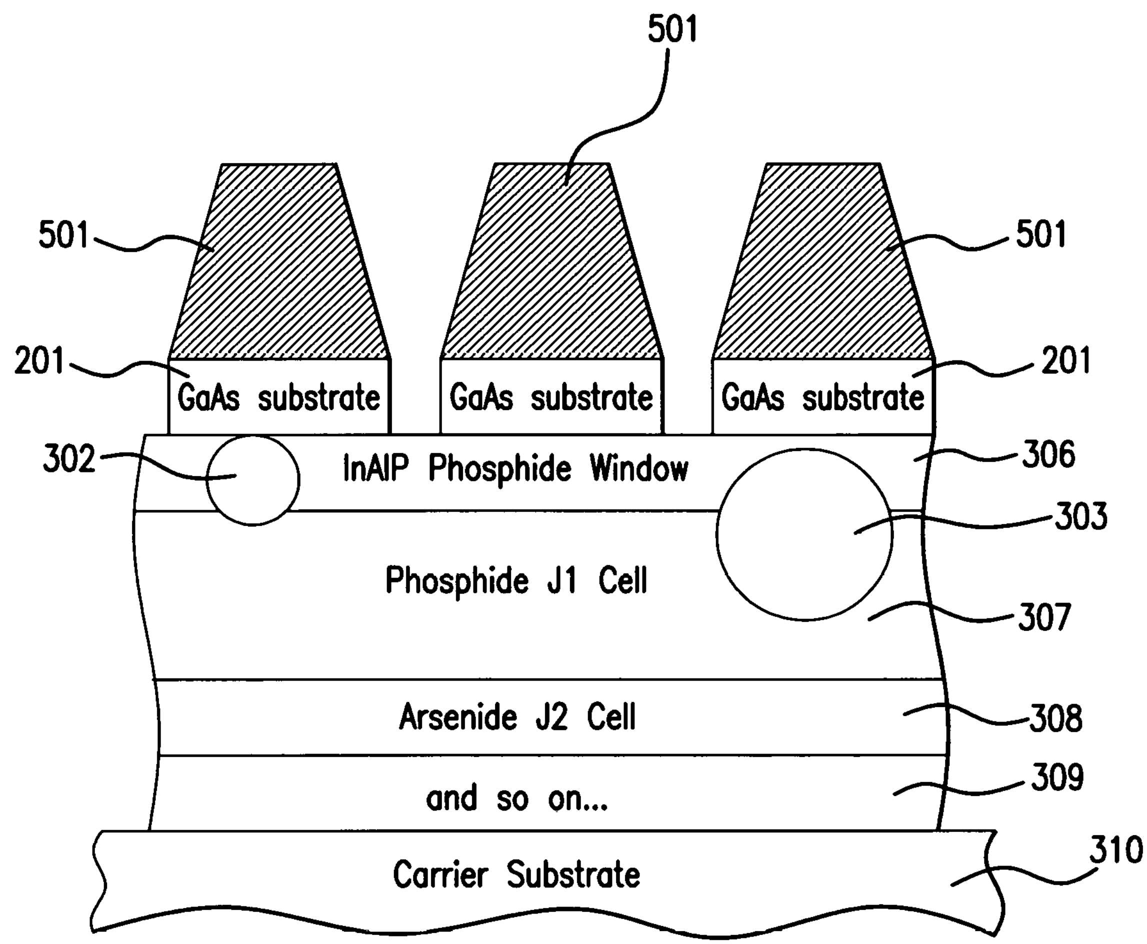
FIG. 5D is a cross-sectional view of the solar cell of FIG. 5C after etching down the substrate layer to the surface of the window layer.

FIG. 5D is a cross-sectional view of the solar cell of FIG. 5C after etching down the substrate layer 201 to the surface of the window layer 105.

Subsequent processing steps (such as deposition of an antireflection coating, mounting of interconnects, etc.) are described in the related applications noted above and need not be repeated here in the interest of brevity.

It should be noted that the multijunction solar cell structure could be formed by any suitable combination of group III to V elements listed in the periodic table subject to lattice constant and band gap requirements, wherein the group III includes boron (B), aluminum (Al), gallium (Ga), indium (In), and thallium (T). The group IV includes carbon (C), silicon (Si), germanium (Ge), and tin (Sn). The group V includes nitrogen (N), phosphorus (P), arsenic (As), antimony (Sb), and bismuth (Bi).

Since the present disclosure (and the related applications noted above) are directed to high volume manufacturing processes using metalorganic vapor phase epitaxy (MOVPE) reactors to form the solar cell epitaxial layers, a short discussion of some of the considerations associated with such processes and methods associated with the formation of the graded interlayer(s) are in order here.

First, it should be noted that the advantage of utilizing an interlayer material such as AlGaInAs is that arsenide-based semiconductor material is much easier to process from a manufacturing standpoint using present state-of-the-art high volume manufacturing metalorganic vapor phase epitaxy (MOVPE) reactors than either the AlGaInAsP, or GaInP compounds, or in general any material including phosphorus. Simply stated, the use of a III-V arsenide compound is much more desirable than a III-V phosphide compound from the perspectives of cost, ease of growth, reactor maintenance, waste handling and personal safety.

The cost advantage of the use of the AlGaInAs quaternary grading material relative to a GaInP ternary grading material, as an example, is a consequence of several factors. First, the use of a GaInP grading approach requires indium mole fractions of the order of 60% (i.e., the required material is $Ga_{0.04}In_{0.6}P$) whereas the use of the AlGaInAs quaternary requires only 15% indium (i.e., the required material is $Al_y(Ga_{0.85}In_{0.15})_{1-y}As$). In addition to the difference in the material itself, there is a further difference in the amount of precursor gases (trimethylgallium, trimethylindium, and arsine) that must be input to the reactor in order to achieve the desired composition. In particular, the ratio of the amount of precursor gases into the reactor to provide Group V elements, to the amount of precursor gases to provide Group III elements (such ratio being referred to as the "input VIII ratio") is typically five to ten times greater to produce a phosphide compound compared to producing an arsenide compound. As a illustrative quantification of the cost of producing a phosphide compound in a commercial operational MOPVE reactor process compared to the cost of producing an arsenide compound, Table 1 below presents the typical pro-form a costs of each element of the AlGaInAs and GaInP compounds for producing a graded interlayer of the type described in the present disclosure expressed on a per mole basis. Of course, like many commodities, the price of chemical compounds fluctuate from time to time and vary in different geographic locations and countries and from supplier to supplier. The prices used in Table 1 are representative for purchases in commercial quantities in the United States at the time of the present disclosure. The cost calculations make the assumption (typical for epitaxial processes using current commercial MOVPE reactors) that the input V/III ratios are 20 and 120 for the arsenide and phosphide compounds respectively. Such a choice of value of the ratio is merely illustrative for a typical process, and some processes may use even higher ratios for producing a graded interlayer of the type described in the present disclosure. The practical consequence of the inlet V/III ratio is that one will use 20 moles of As to one (1) mole of AlGaIn in the formation of the Applicant's quaternary material AlGaInAs, or 120 moles of P to 1 mole of GaIn in the formation of the interlayer using the ternary material GaInP. These assumptions along with the molar cost of each of the constituent elements indicate that the cost of fabrication of the AlGaInAs based grading interlayer will be approximately 25% of the cost of fabrication of a similar phosphide based grading interlayer. Thus, there is an important economic incentive from a commercial and manufacturing perspective to utilize an arsenide compound as opposed to a phosphide compound for the grading interlayer.

TAB LE 1

Cost estimate of one mole of each of the AlGaInAs and GaInP grading layers

| Element | MW (gms) | $/gm | Cost/mole ($) | MF AlGaIn | Cost Molecular Mole of Al.17Ga.68In.15 | MF GaInP | Cost Molecular Mole of Ga.4In.6 |
|---|---|---|---|---|---|---|---|
| Al | 27 | 10.2 | 275.4 | 0.17 | 46.818 | 0 | 0 |
| Ga | 70 | 2.68 | 187.6 | 0.68 | 127.568 | 0.4 | 75.04 |
| In | 115 | 28.05 | 3225.75 | 0.15 | 483.8625 | 0.6 | 1935.45 |
| | | | | Approx.OM Cost/mole = | 658.2485 | | 2010.49 |

The "ease of growth" of an arsenide compound as opposed to a phosphide compound for the grading interlayer in a high volume manufacturing environment is another important consideration and is closely related to issues of reactor maintenance, waste handling and personal safety. More particularly, in a high volume manufacturing environment the abatement differences between arsenide and phosphide based processes affect both cost and safety. The abatement of phosphorus is more time consuming, and hazardous than that required for arsenic. Each of these compounds builds up over time in the downstream gas flow portions of the MOVPE growth reactor. As such, periodic reactor maintenance for removal of these deposited materials is necessary to prevent adverse affects on the reactor flow dynamics, and thus the repeatability and uniformity of the epitaxial structures grown in the reactor. The difference in handling of these waste materials is significant. Arsenic as a compound is stable in air, non-flammable, and only represents a mild irritant upon skin contact. Phosphorus however, must be handled with considerably more care. Phosphorus is very flammable and produces toxic fumes upon burning and it is only moderately stable in air. Essentially the differences are manifest by the need for special handling and containment materials and procedures when handling phosphorus to prevent either combustion or toxic exposure to this material whereas using common personal protection equipment such as gloves, and a particle respirator easily accommodates the handling of arsenic.

Another consideration related to "ease of growth" that should be noted in connection with the advantages of a AlGaInAs based grading interlayer process compared to a AlGaInAsP compound derives from a frequently encountered issue when using an AlGaInAsP compound: the miscibility gap. A miscibility gap will occur if the enthalpy of mixing exceeds the entropy of mixing of two binary compounds AC and BC, where A, B and C are different elements. It is an established fact that the enthalpies of mixing of all ternary crystalline alloys of the form $A_xB_{1-x}C$, based upon the binary semiconductor forms AC and BC are positive leading to miscibility gaps in these compounds. See, for example, the discussion in reference [1] noted below. In this example, the letters A and B designate group III elements and letter C designates a group V element. As such, mixing of the binary compounds is said to occur on the group III sublattice. However, because OMVPE growth takes place under non-equilibrium conditions, the miscibility gap is not really a practical problem for accessing the entire ternary semiconductor phase space. For the case of quaternary compounds of the form $A_xB_{1-x}C_yD_{1-y}$ where mixing of the binary alloys, AC, AD, BC, and BD occurs on both the group III and group V sublattices, the immiscibility problem is accentuated. Specifically for the GaP, InP, GaAs, InAs system, the region of immiscibility is quite large at growth temperatures appropriate for the OMVPE technique. See, for example, the discussion in reference [2] noted below. The resulting miscibility gap will prevent one from producing the requisite AlGaInAsP compounds needed for optical transparent grading of the IMM solar cell.

REFERENCES

V. A. Elyukhin, E. L. Portnoi, E. A. Avrutin, and J. H. Marsh, J. Crystal Growth 173 (1997) pp 69-72. [0195] [2] G. B. Stringfellow, Organometallic Vapor-Phase Epitaxy (Academic Press, New York 1989).

The fabrication of a step graded (or continuous graded) interlayer in an MOCVD process can be more explicitly described in a sequence of conceptual and operational steps which we describe here for pedagogical clarity. First, the appropriate band gap for the interlayer must be selected. In one of the disclosed embodiments, the desired band gap is a constant 1.5 eV; in other embodiments, the desired band gap may be, for example, constant at 1.6 eV or 1.1 eV. In other embodiments, the band gap may vary over the thickness of the graded interlayer. Second, the most appropriate material system (i.e., the specific semiconductor elements to form a compound semiconductor alloy) must be identified. In the disclosed embodiment, these elements are Al, Ga, In, and As. Third, a computation must be made, for example using a computer program, to identify the class of compounds of $Al_y(Ga_xIn_{1-x})_{1-y}As$ for specific x and y that have a band gap of 1.5 eV. An example of such a computer program output that provides a very rough indication of these compounds is illustrated in FIG. 6. Fourth, based upon the lattice constants of the epitaxial layers adjoining the graded interlayer, a specification of the required lattice constants for the top surface of the interlayer (to match the adjacent semiconductor layer), and the bottom surface of the interlayer (to match the adjacent semiconductor layer) must be made. Fifth, based on the required lattice constants, the compounds of $Al_y(Ga_xIn_{1-x})_{1-y}As$ for specific x and y that have a band gap of 1.5 eV may be identified. Again, a computation must be made, and as an example, the data may be displayed in a graph such as FIG. 5 representing the Al, Ga and In mole fractions versus the Al to In mole fraction in a AlGaInAs material system that is necessary to achieve a constant 1.5 eV band gap. Assuming there is a small number (e.g. typically in the range of seven, eight, nine, ten, etc.) of steps or grades between the top surface and the bottom surface, and that the lattice constant difference between each step is made equal, the bold markings in FIG. 5 represent selected lattice constants for each successive sublayer in the interlayer, and the corresponding mole fraction of Al, Ga and In needed to achieve that lattice constant in that respective sublayer may be readily obtained by reference to the axes of the graph. Thus, based on an analysis of the data in FIG. 5, the reactor may be programmed to introduce the appropriate quantities of precursor gases (as determined by flow rates at certain timed intervals) into the reactor so as to achieve a desired specific $Al_y(GaIn_{1-x})_{1-y}As$ composition in that sublayer so that each successive sublayer maintains the constant band gap of 1.5 eV and a monotonically increasing lattice constant. The execution of this sequence of steps, with calculated and determinate precursor gas composition, flow rate, temperature, and reactor time to achieve the growth of a $Al_y(Ga_xIn_{1-x})_{1-y}As$ composition of the interlayer with the desired properties (lattice constant change over thickness, constant band gap over the entire thickness), in a repeatable, manufacturable process, is not to be minimalized or trivialized.

Although one embodiment of the present disclosure utilizes a plurality of layers of AlGaInAs for the metamorphic layer 221 for reasons of manufacturability and radiation transparency, other embodiments of the present disclosure may utilize different material systems to achieve a change in lattice constant from subcell C to subcell D. Other embodiments of the present disclosure may utilize continuously graded, as opposed to step graded, materials. More generally, the graded interlayer may be composed of any of the As, N, Sb based III-V compound semiconductors subject to the constraints of having the in-plane lattice parameter greater or equal to that of the third solar cell and less than or equal to that of the fourth solar cell, and having a band gap energy greater than that of the third solar cell.

It will be understood that each of the elements described above, or two or more together, also may find a useful application in other types of structures or constructions differing from the types of structures or constructions described above.

Although described embodiments of the present disclosure utilizes a vertical stack of four, five, or six subcells, various aspects and features of the present disclosure can apply to stacks with fewer or greater number of subcells, i.e. two junction cells, three junction cells, seven junction cells, etc. Thus, stacks of three or more subcells can include two or more metamorphic grading interlayers, each of which provides a transition in lattice constant between lattice mismatched subcells. Further, in some cases (e.g., in the case of seven or more junction cells), the use of more than two metamorphic grading interlayer may also be utilized.

In addition, although the disclosed embodiments are configured with top and bottom electrical contacts, the subcells may alternatively be contacted by means of metal contacts to laterally conductive semiconductor layers between the subcells. Such arrangements may be used to form 3-terminal, 4-terminal, and in general, n-terminal devices. The subcells can be interconnected in circuits using these additional terminals such that most of the available photogenerated current density in each subcell can be used effectively, leading to high efficiency for the multijunction cell, notwithstanding that the photogenerated current densities are typically different in the various subcells.

As noted above, the solar cell described in the present disclosure may utilize an arrangement of one or more, or all, homojunction cells or subcells, i.e., a cell or subcell in which the p-n junction is formed between a p-type semiconductor and an n-type semiconductor both of which have the same chemical composition and the same band gap, differing only in the dopant species and types, and one or more heterojunction cells or subcells. Subcell A, with p-type and n-type GaInP is one example of a homojunction subcell. Alternatively, as more particularly described in U.S. patent application Ser. No. 12/023,772 filed Jan. 31, 2008, the solar cell of the present disclosure may utilize one or more, or all, heterojunction cells or subcells, i.e., a cell or subcell in which the p-n junction is formed between a p-type semiconductor and an n-type semiconductor having different chemical compositions of the semiconductor material in the n-type regions, and/or different band gap energies in the p-type regions, in addition to utilizing different dopant species and type in the p-type and n-type regions that form the p-n junction.

In some cells, a thin so-called "intrinsic layer" may be placed between the emitter layer and base layer, with the same or different composition from either the emitter or the base layer. The intrinsic layer may function to suppress minority-carrier recombination in the space-charge region. Similarly, either the base layer or the emitter layer may also be intrinsic or not-intentionally-doped ("NID") over part or all of its thickness.

The composition of the window or BSF layers may utilize other semiconductor compounds, subject to lattice constant and band gap requirements, and may include AlInP, AlAs, AlP, AlGaInP, AlGaAsP, AlGaInAs, AlGaInPAs, GaInP, GaInAs, GaInPAs, AlGaAs, AlInAs, AlInPAs, GaAsSb, AlAsSb, GaAlAsSb, AlInSb, GaInSb, AlGaInSb, AlN, GaN, InN, GaInN, AlGaInN, GaInNAs, AlGaInNAs, ZnSSe, CdSSe, and similar materials, and still fall within the spirit of the present invention.

While the solar cell described in the present disclosure has been illustrated and described as embodied in an inverted metamorphic multijunction solar cell, it is not intended to be limited to the details shown, since various modifications and structural changes may be made without departing in any way from the spirit of the present invention.

Thus, while the description of the semiconductor device described in the present disclosure has focused primarily on solar cells or photovoltaic devices, persons skilled in the art know that other optoelectronic devices, such as thermophotovoltaic (TPV) cells, photodetectors and light-emitting diodes (LEDS), are very similar in structure, physics, and materials to photovoltaic devices with some minor variations in doping and the minority carrier lifetime. For example, photodetectors can be the same materials and structures as the photovoltaic devices described above, but perhaps more lightly-doped for sensitivity rather than power production. On the other hand LEDs can also be made with similar structures and materials, but perhaps more heavily-doped to shorten recombination time, thus radiative lifetime to produce light instead of power. Therefore, this invention also applies to photodetectors and LEDs with structures, compositions of matter, articles of manufacture, and improvements as described above for photovoltaic cells.

Without further analysis, from the foregoing others can, by applying current knowledge, readily adapt the present invention for various applications. Such adaptations should and are intended to be comprehended within the meaning and range of equivalence of the following claims. Accordingly, other implementations are within the scope of the claims.

What is claimed is:

1. A method of manufacturing a solar cell comprising:

providing a growth semiconductor substrate with a top surface having a doping in the range of $1\times10^{18}$ to $1\times10^{20}$ charge carriers/$cm^3$;

depositing a window layer on the top surface of the growth semiconductor substrate;

depositing a sequence of layers of semiconductor material forming a solar cell having a first surface directly adjacent to and on the window layer, and a second surface opposite thereto;

providing a glass surrogate substrate having a first surface and an opposite second surface;

bonding an adhesive polyimide layer to the first surface of the glass surrogate substrate;

adjoining the adhesive polyimide layer disposed on the first surface of the glass surrogate substrate to the second surface of the sequence of layers of semiconductor material forming a solar cell and permanently bonding it thereto; and removing a portion of the growth semiconductor substrate so that only a portion of the growth semiconductor substrate having a thickness in the range of 0.5 μm to 10 μm remains.

2. A method as defined in claim 1, wherein the portion of the growth semiconductor substrate that is removed after the glass surrogate substrate has been attached is performed by grinding, polishing, lapping or etching of the growth semiconductor substrate.

3. A method as defined in claim 1, further comprising forming grid electrodes on the top surface of the growth semiconductor substrate to form a top surface of the solar cell.

4. A method as defined in claim 1, wherein said step of depositing a sequence of layers of semiconductor material includes forming a first solar subcell on said growth semiconductor substrate having a first band gap; forming a second solar subcell over said first solar subcell having a second band gap smaller than said first band gap; forming a grading interlayer having a first side adjacent to the second solar subcell and a second side opposite to the first side, the grading interlayer having a third band gap larger than said second band gap; forming a third solar subcell over the second side of the grading interlayer and having a fourth band gap smaller than said second band gap such that said third solar subcell is lattice mismatched with respect to said second solar subcell.

5. A method of manufacturing a solar cell as defined in claim 4, wherein said first solar subcell is composed of an InGa(Al)P emitter region and an InGa(Al)P base region.

6. A method as defined in claim 4, wherein said first solar subcell is composed of an GaInP, GaAs, GaInAs, GaAsSb, or GaInAsN emitter region and an GaAs, GaInAs, GaAsSb, or GaInAsN base region, and the second solar subcell is composed of an InGaP emitter layer and a GaAs or GaInAs base layer.

7. The method as defined in claim 4, wherein the third solar subcell is composed of an InGaAs base and emitter layer, or a InGaAs base layer and a InGaP emitter layer.

8. The method as defined as claim 4, wherein the grading interlayer is compositionally graded to lattice match the second solar subcell on one side of the grading interlayer and the third solar subcell on the second side of the grading interlayer, and is composed of $(In_xGa_{1-x})_y Al_{1-y}As$, wherein $0<x<1$ and $0<y<1$ with x and y selected such that the third band gap of the grading interlayer is greater than said second band gap.

9. The method as defined in claim 4, wherein the grading interlayer has a band gap in the range of 1.5 to 1.6 eV throughout its thickness.

10. A method as defined in claim 4, further comprising depositing a threading dislocation inhibition layer having a thickness in the range of 0.10 to 1.0 microns and disposed between the second solar subcell and the grading interlayer and having a different composition from the grading interlayer.

11. A method as defined in claim 10, further comprising depositing a second threading dislocation inhibition layer having a thickness in the range of 0.10 to 1.0 micron and composed of InGa(Al)P, the second threading dislocation inhibition layer being disposed directly adjacent to said grading interlayer and the third solar subcell for reducing the propagation of threading dislocations, said second threading dislocation inhibition layer having a composition different from a composition of the first threading dislocation inhibition layer and the grading interlayer.

12. A method of manufacturing a solar cell as defined in claim 1, wherein said growth semiconductor substrate is composed of GaAs having a thickness of between 300 μm and 700 μm, is placed in a growth reactor, and the top surface is doped in the growth reactor.

13. A method of manufacturing a solar cell as defined in claim 12, wherein said growth semiconductor substrate is composed of a bulk n type GaAs substrate with a top surface being doped with an n-type dopant material by an in-situ process.

14. A method of manufacturing a solar cell as defined in claim 1, wherein the step of depositing a sequence of layers of semiconductor material on the window layer comprises:

depositing a first sequence of layers of semiconductor material forming a first solar subcell having a first band gap directly on the window layer;

forming a second solar subcell adjacent to said first solar subcell and having a second band gap smaller than said first band gap;

forming a first grading interlayer having a first side adjacent to said second solar subcell and a second side opposite to the first side; said first grading interlayer having a third band gap greater than said second band gap;

forming a third solar subcell adjacent to said first grading interlayer, said third solar subcell having a fourth band gap smaller than said second band gap such that said third solar subcell is lattice mismatched with respect to said second solar subcell;

forming a second grading interlayer having a first side adjacent to said third solar subcell and a second side opposite to the first side; said second grading interlayer having a fifth band gap greater than said fourth band gap; and forming a fourth solar subcell adjacent to said second grading interlayer, said fourth solar subcell having a sixth band gap smaller than said fourth band gap such that said fourth solar subcell is lattice mismatched with respect to said third solar subcell;

wherein the second grading interlayer is compositionally graded to lattice match the third solar subcell on said first side of the second grading interlayer and the fourth solar subcell on said second side of the second grading interlayer.

15. A method as defined in claim 1, wherein the adhesive polyimide layer has a first surface and a second surface opposite the first surface, and wherein the step of bonding an adhesive polyimide layer to the first surface of the glass surrogate substrate comprises:

bonding the first surface of the adhesive polyimide layer to the glass surrogate substrate by a thermocompressive technique at a curing temperature above 350 degrees C.; and subsequently adjoining the second surface of the adhesive polyimide layer to the second surface of the sequence of layers of semiconductor material forming a solar cell, the adjoining step being performed at a temperature of about 300 degrees C.

16. A method as defined in claim 1, wherein the window layer is composed of AlInP.

17. A method of manufacturing a solar cell comprising:

providing a first n type substrate including a highly doped n++ type surface layer;

forming a window layer on the highly doped n++ surface layer of the first n type substrate;

forming an upper first solar subcell having a first band gap directly on the window layer;

forming a second solar subcell adjacent to said upper first solar subcell and having a second band gap smaller than said first band gap;

forming a first grading interlayer adjacent to said second solar subcell; said first grading interlayer having a third band gap greater than said second band gap;

forming a third solar subcell adjacent to said first grading interlayer, said third solar subcell having a fourth band gap smaller than said second band gap such that said third solar subcell is lattice mismatched with respect to said second solar subcell;

forming a second grading interlayer adjacent to said third solar subcell; said second grading interlayer having a fifth band gap greater than said fourth band gap;

forming a lower fourth solar subcell adjacent to said second grading interlayer, said lower fourth solar subcell having a sixth band gap smaller than said fourth band gap such that said lower fourth solar subcell is lattice mismatched with respect to said third solar subcell;

mounting a surrogate substrate on top of the lower fourth solar subcell; and removing a bottom portion of the first n type substrate so that only the highly doped n++ surface layer or a portion thereof having a thickness in the range of 0.5 μm to 10 μm remains of the first n type substrate.

* * * * *